United States Patent
Rahman et al.

(10) Patent No.: US 10,225,069 B2
(45) Date of Patent: Mar. 5, 2019

(54) CDR CIRCUIT AND RECEIVING CIRCUIT

(71) Applicant: FUJITSU LIMITED, Kawasaki-shi, Kanagawa (JP)

(72) Inventors: Wahid Rahman, Kanata (CA); Ali Sheikholeslami, Toronto (CA); Takayuki Shibasaki, Kawasaki (JP); Hirotaka Tamura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/881,903

(22) Filed: Jan. 29, 2018

(65) Prior Publication Data

US 2018/0227114 A1   Aug. 9, 2018

(30) Foreign Application Priority Data

Feb. 3, 2017   (JP) .................................. 2017-018374

(51) Int. Cl.
*H03L 7/08* (2006.01)
*H04L 7/00* (2006.01)
(Continued)

(52) U.S. Cl.
CPC ............ *H04L 7/0037* (2013.01); *H03L 7/085* (2013.01); *H03L 7/0807* (2013.01); *H03L 7/087* (2013.01);
(Continued)

(58) Field of Classification Search
None
See application file for complete search history.

(56) References Cited

U.S. PATENT DOCUMENTS 5,012,494 A * 4/1991 Lai .................... H03K 3/0315
                                                331/17
5,473,639 A * 12/1995 Lee .................... H03L 7/0995
                                                331/16
(Continued)

FOREIGN PATENT DOCUMENTS

JP   2015-084487   4/2015
JP   2016-072932   5/2016

OTHER PUBLICATIONS

Shibasaki et al., "A 56Gb/s NRZ—Electrical 247mW/lane Serial-Link Transceiver in 28nm CMOS," IEEE ISSCC 2016; Session 3, Ultra-High-Speed Transceivers, 3.5, pp. 64-65, Feb. 2016 (3 pages). (Cited in the Applicants IDS, dated Jan. 29, 2018).*
(Continued)

*Primary Examiner* — Berhanu Tadese
(74) *Attorney, Agent, or Firm* — Fujitsu Patent Center

(57) ABSTRACT

A CDR circuit includes: a comparison circuit that receives data signal on which a first clock signal is superimposed, and outputs a comparison result obtained by comparing the data signal with three different threshold values at a timing synchronized with a second clock signal; a data pattern detection circuit that detects an occurrence of a data pattern, based on the comparison result; a frequency detection circuit that outputs, when an occurrence of the data pattern is detected, a detection result indicating whether a second frequency of the second clock signal is higher than a first frequency of the first clock signal; an adjustment circuit that outputs, based on the detection result, an adjustment signal for adjusting a phase of the second clock signal and the second frequency; and an oscillator circuit that outputs the second clock signal with the phase and the second frequency adjusted, based on the adjustment signal.

12 Claims, 20 Drawing Sheets

(51) Int. Cl.
*H03L 7/085* (2006.01)
*H03L 7/087* (2006.01)
*H03L 7/099* (2006.01)
*H04L 7/033* (2006.01)

(52) U.S. Cl.
CPC ............ *H03L 7/099* (2013.01); *H04L 7/0079* (2013.01); *H04L 7/033* (2013.01)

(56) References Cited

U.S. PATENT DOCUMENTS

| | | | | |
|---|---|---|---|---|
| 6,055,286 A * | 4/2000 | Wu | H03L 7/087 | 331/1 A |
| 6,754,256 B1 * | 6/2004 | Kubo | H04B 1/7075 | 370/335 |
| 7,590,207 B1 * | 9/2009 | Shumarayev | H03L 7/087 | 331/11 |
| 8,477,895 B1 * | 7/2013 | Wang | H04L 27/0014 | 375/354 |
| 8,694,837 B1 * | 4/2014 | Qian | H04L 1/203 | 714/704 |
| 8,791,735 B1 * | 7/2014 | Shibasaki | H03L 7/0812 | 327/147 |
| 9,025,655 B1 * | 5/2015 | Ramadoss | H04L 25/03885 | 375/219 |
| 9,059,837 B1 * | 6/2015 | Tsunoda | H04L 7/033 | |
| 9,191,187 B2 * | 11/2015 | Shibasaki | H04L 7/0079 | |
| 9,264,026 B2 * | 2/2016 | Shibasaki | H03K 5/135 | |
| 9,287,883 B2 * | 3/2016 | Shibasaki | H03L 7/0807 | |
| 9,344,269 B2 * | 5/2016 | Shibasaki | H03L 7/0891 | |
| 2002/0021153 A1 * | 2/2002 | Saeki | H03K 5/133 | 327/163 |
| 2003/0202804 A1 * | 10/2003 | Hasegawa | H03L 7/087 | 398/202 |
| 2004/0124929 A1 * | 7/2004 | Ishiwaki | H03L 7/087 | 331/1 R |
| 2005/0060616 A1 * | 3/2005 | Cho | H03K 5/135 | 714/34 |
| 2005/0201491 A1 * | 9/2005 | Wei | H04L 7/0337 | 375/326 |
| 2006/0285366 A1 * | 12/2006 | Radecker | H02M 3/33507 | 363/16 |
| 2007/0230640 A1 * | 10/2007 | Bryan | H04L 25/03057 | 375/349 |
| 2008/0069199 A1 * | 3/2008 | Chen | H04L 25/03057 | 375/233 |
| 2008/0310569 A1 * | 12/2008 | Takeuchi | H04L 7/0337 | 375/357 |
| 2009/0224806 A1 * | 9/2009 | Huang | H04L 7/0062 | 327/72 |
| 2009/0285277 A1 * | 11/2009 | Sunaga | H04B 3/06 | 375/233 |
| 2009/0290672 A1 * | 11/2009 | Ho | H03L 7/0814 | 375/374 |
| 2010/0046683 A1 * | 2/2010 | Beukema | H04L 7/0062 | 375/355 |
| 2010/0202578 A1 * | 8/2010 | Tomita | H03L 7/081 | 375/371 |
| 2010/0238993 A1 * | 9/2010 | Huang | H04L 7/0337 | 375/233 |
| 2010/0289544 A1 * | 11/2010 | Lee | H04L 7/0062 | 327/159 |
| 2011/0235688 A1 * | 9/2011 | Umeda | H04L 5/0048 | 375/216 |
| 2011/0311008 A1 * | 12/2011 | Slezak | H03M 9/00 | 375/353 |
| 2012/0092049 A1 * | 4/2012 | Hasegawa | H04B 3/04 | 327/156 |
| 2012/0187986 A1 * | 7/2012 | Hamano | H03K 3/356139 | 327/156 |
| 2012/0201289 A1 * | 8/2012 | Abdalla | H04L 25/0272 | 375/233 |
| 2012/0230384 A1 * | 9/2012 | Chiba | H04L 25/03057 | 375/233 |
| 2013/0216003 A1 * | 8/2013 | Zhuang | H04L 25/02 | 375/316 |
| 2013/0243056 A1 * | 9/2013 | Chmelar | H04L 7/033 | 375/224 |
| 2013/0243070 A1 * | 9/2013 | Ito | H04L 27/01 | 375/233 |
| 2013/0243107 A1 * | 9/2013 | Chmelar | H04L 25/03057 | 375/259 |
| 2013/0243127 A1 * | 9/2013 | Chmelar | H04L 25/03057 | 375/316 |
| 2014/0097878 A1 * | 4/2014 | Sindalovsky | H03L 7/087 | 327/156 |
| 2014/0169426 A1 * | 6/2014 | Aziz | H04L 25/03057 | 375/224 |
| 2014/0286381 A1 * | 9/2014 | Shibasaki | H03L 7/089 | 375/226 |
| 2015/0117579 A1 * | 4/2015 | Shibasaki | H04L 7/0058 | 375/355 |
| 2015/0200674 A1 * | 7/2015 | Chaivipas | H03L 7/0814 | 327/115 |
| 2015/0207618 A1 * | 7/2015 | Tsunoda | H04L 7/0331 | 375/374 |
| 2015/0234423 A1 * | 8/2015 | Shvydun | G06F 1/12 | 713/501 |
| 2015/0326385 A1 * | 11/2015 | Hashida | H04L 7/0033 | 375/359 |
| 2016/0099718 A1 * | 4/2016 | Shibasaki | H03L 7/085 | 327/155 |
| 2016/0194027 A1 * | 7/2016 | Kondo | G01L 5/221 | 324/207.25 |
| 2017/0026047 A1 * | 1/2017 | Shibasaki | H03L 7/087 | |
| 2018/0019864 A1 * | 1/2018 | Tsunoda | H03L 7/0807 | |
| 2018/0227114 A1 * | 8/2018 | Rahman | H03L 7/087 | |
| 2018/0241540 A1 * | 8/2018 | Shibasaki | H04L 7/02 | |

OTHER PUBLICATIONS

S. Jalali et al., "An 8mW Frequency Detector for IOGb/s Half-Rate CDR using Clock Phase Selection," IEEE Custom Integrated Circuits Conference (CICC), pp. 1-4, Sep. 2013 (3 pages). (Cited in the Applicants IDS, dated Jan. 29, 2018).*
T. Shibasaki et al., "A 56Gb/s NRZ-Electrical 247mW/lane Serial-Link Transceiver in 28nm CMOS," IEEE ISSCC 2016, Session 3, Ultra-High-Speed Transceivers, 3.5, pp. 64-65, Feb. 2016 (3 pages).
M. S. Jalali et al., "An 8mW Frequency Detector for 10Gb/s Half-Rate CDR using Clock Phase Selection," IEEE Custom Integrated Circuits Conference (CICC), pp. 1-4, Sep. 2013 (3 pages).

* cited by examiner

CDR CIRCUIT AND RECEIVING CIRCUIT

CROSS-REFERENCE TO RELATED APPLICATION

This application is based upon and claims the benefit of priority of the prior Japanese Patent Application No. 2017-18374, filed on Feb. 3, 2017, the entire contents of which are incorporated herein by reference.

FIELD

The embodiments discussed herein are related to a clock data recovery (CDR) circuit and a receiving circuit.

BACKGROUND

Along with improvement of the performance of information processing devices, the data rate of data signals transmitted and received internally or externally of the devices is being increased.

Related techniques are disclosed in, for example, Japanese Laid-open Patent Publication Nos. 2016-072932 and 2015-084487, T. Shibasaki et al., "A 56 Gb/s NRZ-Electrical 247 mW/lane Serial-Link Transceiver in 28 nm CMOS," in IEEE ISSCC Dig. Tech. Papers, February 2016, pp. 64-65, and S. Jalali et al., "An 8 mW Frequency Detector for 10 Gb/s Half-Rate CDR using Clock Phase Selection," in IEEE Custom Integrated Circuits Conference (CICC), pp. 1-4, September 2013.

SUMMARY

According to an aspect of the embodiments, a CDR circuit includes: a comparison circuit that receives data signal on which a first clock signal is superimposed, and outputs a result of comparison obtained by comparing the data signal with three different threshold values at a timing synchronized with a second clock signal; a data pattern detection circuit that detects an occurrence of a data pattern in which three consecutive bits in the data signal are a first pattern or a second pattern, based on the result of comparison; a frequency detection circuit that outputs, when an occurrence of the data pattern is detected at least three times, a detection result indicating whether or not a second frequency of the second clock signal is higher than a first frequency of the first clock signal, based on a change in the result of comparison between the data signal at a time of detection of a second bit of the data pattern and the three threshold values; an adjustment circuit that outputs, based on the detection result, an adjustment signal for adjusting a phase of the second clock signal and the second frequency; and an oscillator circuit that outputs the second clock signal with the phase and the second frequency adjusted, based on the adjustment signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In a receiving circuit that receives a data signal, CDR which recovers data and a clock signal from the transmitted data signal is performed. For instance, in the CDR, sampling of a data signal is performed not using a reference clock but using a clock signal recovered from the transmitted data signal. In this case, a phase difference and a frequency difference between the recovered clock signal and the data signal are detected, and the clock signal is adjusted so that correct data is obtained.

For instance, a frequency difference is detected using 4× sampling system that samples a data signal four times per unit interval (UI). In this case, a circuit that performs sampling has a large area. Thus, a frequency difference is detected, for instance, by detecting a direction of rotation of the phase of the data signal in three regions in a phase space based on a result of comparison between three threshold values and the data signal at two timings of clock signals having two different phases.

For instance, a CDR circuit that detects a frequency difference using clock signals having two different phases has a smaller circuit area than a CDR circuit that uses the 4× sampling system, however may have a relatively large circuit area because the clock signals having two different phases are used.

For instance, it is desirable to provide a CDR circuit with a reduced circuit area.

Figure 1:
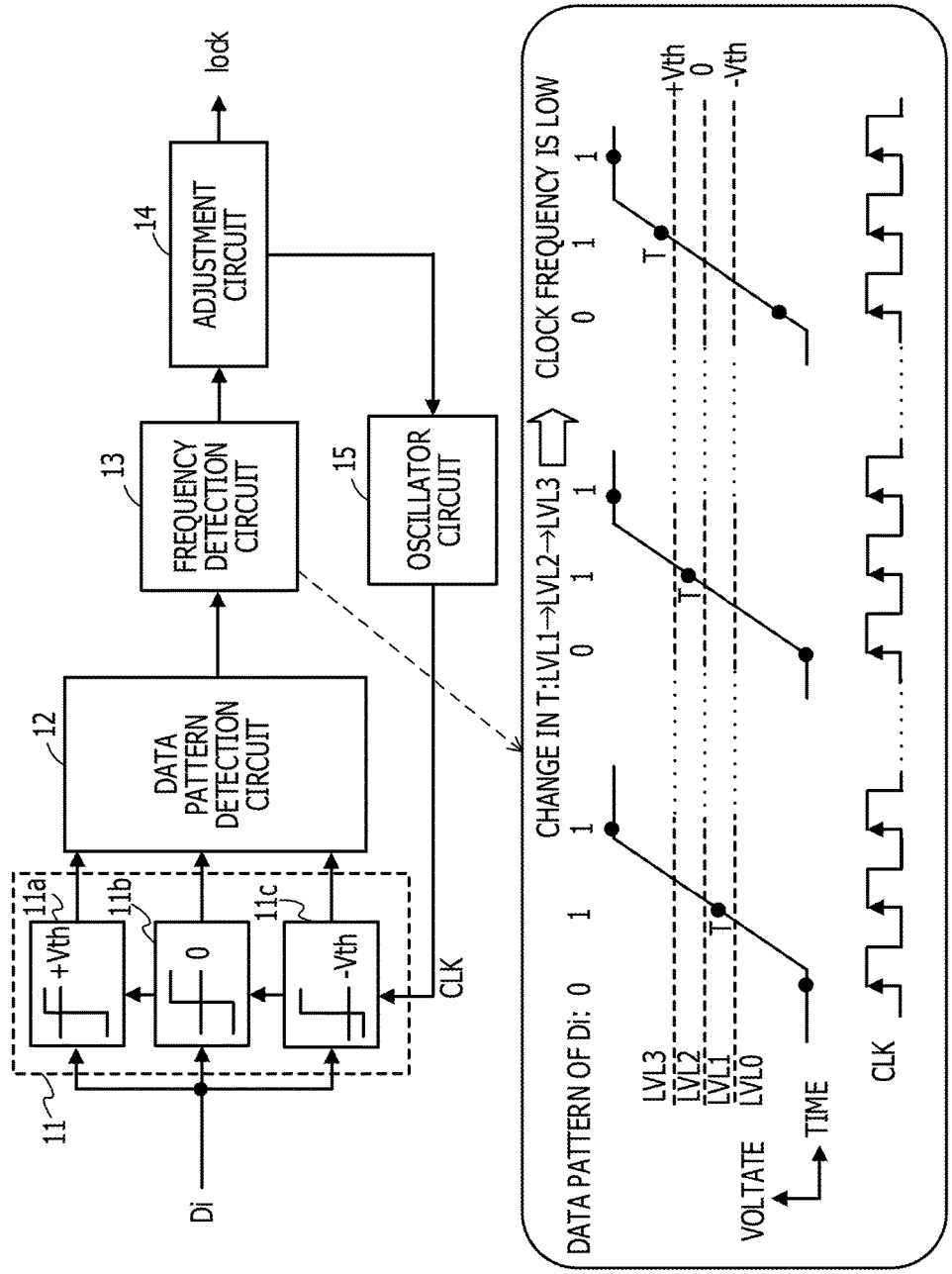
FIG. 1 illustrates an example CDR circuit.

FIG. 1 illustrates an example CDR circuit.

The CDR circuit 10 is a circuit that performs CDR based on sampling (baud rate) once per UI not using a reference clock. The CDR circuit 10 has a comparison circuit unit 11, a data pattern detection circuit 12, a frequency detection circuit 13, an adjustment circuit 14, and an oscillator circuit 15.

The comparison circuit unit 11 receives data signal Di on which a clock signal is superimposed, and outputs a result of comparison obtained by comparing the data signal Di with three different threshold values at a timing synchronized with a clock signal CLK outputted by the oscillator circuit 15. The three different threshold values are, for instance, two voltage values and the voltage value halfway between the two. In the following example, a description is given using +Vth [V], −Vth [V] as the two voltage values and 0 [V] as the value halfway between the two.

The comparison circuit unit 11 has comparison circuits 11a, 11b, and 11c. The comparison circuits 11a to 11c each output a result of comparison of the data signal Di with +Vth [V], −Vth [V], or 0 [V], for instance, at one of rising timing and falling timing of the clock signal CLK.

The comparison circuit 11a outputs a result of comparison of the data signal Di with +Vth [V]. For instance, when the data signal Di is greater than +Vth [V], the comparison circuit 11a outputs 1 (or a signal having a logical level of high (H) level), and when the data signal Di is less than or equal to +Vth [V], the comparison circuit 11a outputs 0 (or a signal having a logical level of low (L) level).

The comparison circuit 11b outputs a result of comparison of the data signal Di with 0 [V]. For instance, when the data signal Di is greater than 0 [V], the comparison circuit 11b outputs 1 (or a signal having a logical level of H level), and when the data signal Di is less than or equal to 0 [V], the comparison circuit 11b outputs 0 (or a signal having a logical level of L level).

The comparison circuit 11c outputs a result of comparison of the data signal Di with −Vth [V]. For instance, when the data signal Di is greater than −Vth [V], the comparison circuit 11c outputs 1 (or a signal having a logical level of H level), and when the data signal Di is less than or equal to −Vth [V], the comparison circuit 11c outputs 0 (or a signal having a logical level of L level).

The data pattern detection circuit 12 detects an occurrence of the data pattern in which three consecutive bits of the data signal Di are 011 or 100, based on the results of comparison outputted by the comparison circuit unit 11. For instance, when a result of determination for the data signal Di one UI before is 0, and the data signal Di is less than or equal to −Vth [V], the data pattern detection circuit 12 determines the value of the data signal Di to be 0. When the data signal Di is greater than −Vth [V], the data pattern detection circuit 12 determines the value of the data signal Di to be 1. Also, when a result of determination for the data signal Di one UI before is 1, and the data signal Di is less than or equal to +Vth [V], the data pattern detection circuit 12 determines the value of the data signal Di to be 0. When the data signal Di is greater than +Vth [V], the data pattern detection circuit 12 determines the value of the data signal Di to be 1.

Although a circuit that outputs the determined value of the data signal Di is not illustrated in FIG. 1, the data pattern detection circuit 12 may output the determined value of the data signal Di. Alternatively, a speculative decision feedback equalizer (DFE) may also be used as a data decision circuit.

When an occurrence of the above-mentioned data pattern is detected at least 3 times, the frequency detection circuit 13 detects a change in the result of comparison of the data signal Di at the time of detection of the second bit of the data pattern with +Vth [V], −Vth [V], and 0 [V]. The frequency detection circuit 13 then outputs a detection result, based on the change, indicating whether or not the frequency of the clock signal CLK outputted by the oscillator circuit 15 is higher than the frequency (hereinafter may be referred to as the frequency of the data signal Di) of the clock signal superimposed on the data signal Di.

FIG. 1 illustrates the situation of an example of change in the size "T" of data signal Di at the time of sampling the second bit when an occurrence of the data pattern of 011 is detected three times. The vertical axis indicates voltage and the horizontal axis indicates time. In the example of FIG. 1, the voltage range lower than or equal to −Vth [V] is denoted by LVL0, the voltage range higher than −Vth [V] and lower than or equal to 0 [V] is denoted by LVL1, the voltage range higher than 0 [V] and lower than or equal to +Vth [V] is denoted by LVL2, and the voltage range higher than +Vth [V] is denoted by LVL3.

An upward slope or a downward slope is formed in a received waveform of data signal Di having a certain data pattern due to the effect of an inter-symbol interference (ISI). For instance, as illustrated in FIG. 1, an upward slope is formed in a received waveform of data signal Di having the data pattern of 011.

When the frequency of the clock signal CLK for sampling data signal Di is lower than the frequency of the data signal Di, the size "T" of the data signal Di sampled in a portion of an upward slope is increased each time the data pattern of 011 is detected. In the example of FIG. 1, "T" changes from LVL1, to LVL2, and LVL3.

When the above-mentioned change in "T" is detected, the frequency detection circuit 13 outputs a detection result indicating that the frequency of the clock signal CLK is higher than the frequency the data signal Di, based on the result of comparison outputted by the comparison circuit unit 11. It is to be noted that when "T" changes for LVL0, to LVL1, LVL3 the frequency detection circuit 13 may output a detection result indicating that the frequency of the clock signal CLK is lower than the frequency the data signal Di.

Figure 2:
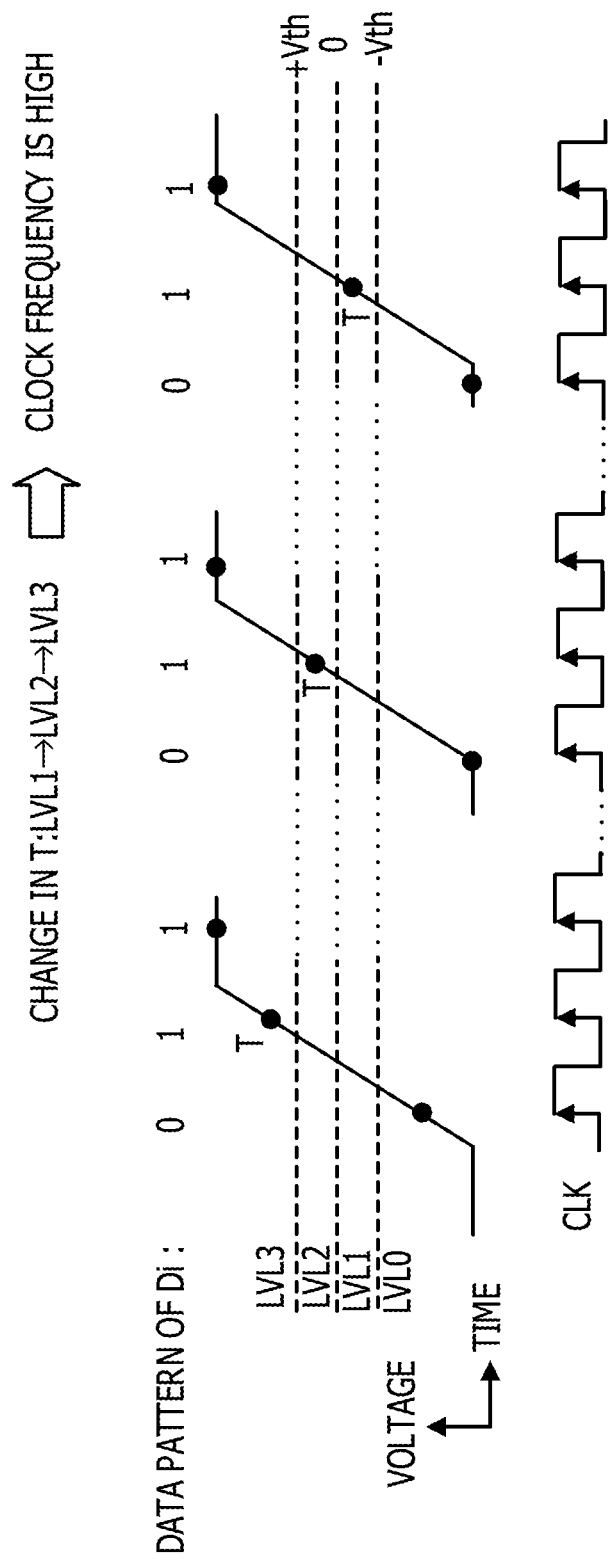
FIG. 2 illustrates an example change in "T" when the frequency of a clock signal CLK is higher than the frequency of a data signal Di.

FIG. 2 illustrates an example change in "T" when the frequency of the clock signal CLK is higher than the frequency of the data signal Di. FIG. 2 illustrates the situation of an example change in "T" when the frequency of the clock signal CLK is higher than the frequency of the data signal Di, and an occurrence of the data pattern of 011 is detected three times. The vertical axis indicates voltage and the horizontal axis indicates time.

When the frequency of the clock signal CLK for sampling data signal Di is higher than the frequency of the data signal Di, the size "T" of the data signal Di sampled in a portion of an upward slope is decreased each time the data pattern of 011 is detected. In the example of FIG. 2, "T" changes from LVL3, to LVL2, and LVL1.

When the above-mentioned change in "T" is detected, the frequency detection circuit 13 outputs a detection result indicating that the frequency of the clock signal CLK is lower than the frequency the data signal Di, based on the result of comparison outputted by the comparison circuit unit 11. It is to be noted that when "T" changes for LVL2, to LVL1, LVL0 the frequency detection circuit 13 may output a detection result indicating that the frequency of the clock signal CLK is higher than the frequency the data signal Di.

Also, at the time of detection of the data pattern of 100, the frequency detection circuit 13 can also detect whether or not the frequency of the clock signal CLK higher than the frequency of the data signal Di based on the change in the size of the data signal Di at the time of sampling of the second bit of the data pattern.

A downward slope is formed in a received waveform of data signal Di having the data pattern of 100. When the frequency of the clock signal CLK for sampling data signal Di is lower than the frequency of the data signal Di, the size "T" of the data signal Di sampled in a portion of a downward slope is increased each time the data pattern of 100 is detected. When the frequency of the clock signal CLK for sampling data signal Di is higher than the frequency of data signal Di, the size "T" of the data signal Di sampled in a portion of a downward slope is decreased each time the data pattern of 100 is detected. The frequency detection circuit 13 detects such a change based on the result of comparison outputted by the comparison circuit unit 11, and outputs a detection result indicating whether or not the frequency of the clock signal CLK is higher than the frequency of the data signal Di.

The range and detection rate of the frequency of detectable clock signal CLK are varied according to the width of LVL1 and LVL2. If the LVL1 and LVL2 are too narrow, even when the frequency of the clock signal CLK is higher or lower than the frequency of the data signal Di, the change in "T" (rotation of the phase) as described above may not be detected. Thus, a desired detection rate of frequency can be achieved by setting +Vth [V] and −Vth [V] and determining the width of LVL1 and LVL2 according to the characteristics, such as the through rate of the data signal Di.

The adjustment circuit 14 of FIG. 1 outputs an adjustment signal for adjusting the phase and frequency of the clock signal CLK based on the detection result outputted by the frequency detection circuit 13. In addition, the adjustment circuit 14 outputs a signal lock indicating whether or not the frequency of the data signal Di and the frequency of the clock signal CLK are synchronized, based on a detection result, for instance. For instance, the adjustment circuit 14 compares the number of detection events in which the frequency of the clock signal CLK is higher than the frequency of the data signal Di with the number of detection events in which the frequency of the clock signal CLK is lower than the frequency of the data signal Di in a predetermined period. When the absolute value of the difference between the numbers of output is less than a threshold value, and the sum of the both numbers of output is less than another threshold value, the adjustment circuit 14 outputs a signal lock indicating that both frequencies are synchronized.

The oscillator circuit 15 outputs a clock signal CLK with the phase and frequency adjusted, based on the adjustment signal outputted by the adjustment circuit 14. As described above, the CDR circuit 10 detects a data pattern of 011 or 100, and performs frequency detection based on the change in the result of comparison of the data signal Di at the time of sampling the second bit of the data pattern with three threshold values. Thus, the frequency detection can be performed by CDR circuit 10 based on the baud rate, and the number of clock signals generated for frequency detection can be reduced, as compared with the case of a CDR circuit in relate art, and thus the number of comparison circuits is reduced, and the area of the circuits can be reduced. Since the circuit area can be reduced, reduction of the power consumption associated with the operation of the circuits is also possible.

Figure 3:
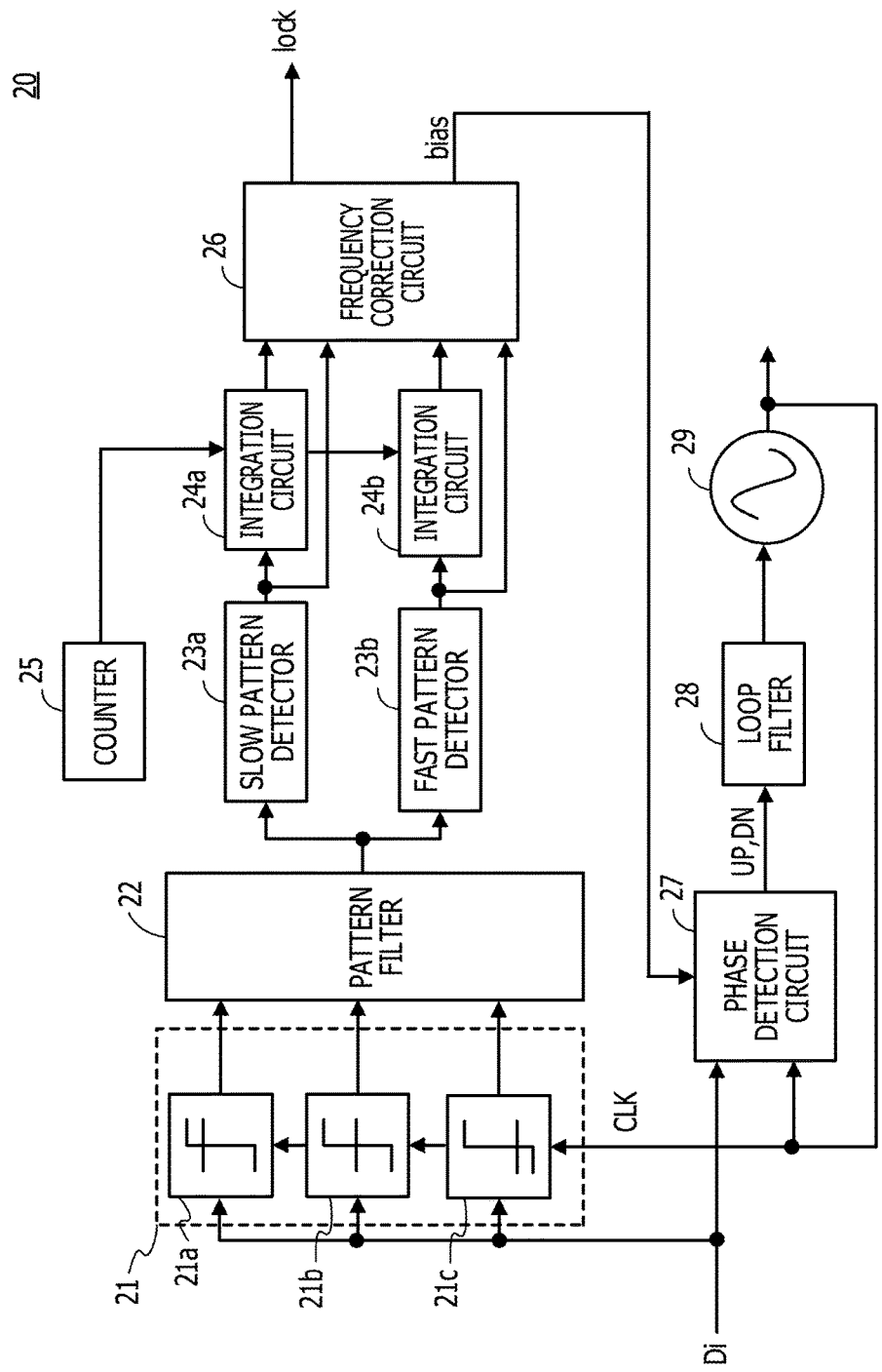
FIG. 3 illustrates an example CDR circuit.

FIG. 3 illustrates an example CDR circuit. The CDR circuit 20 illustrated in FIG. 3 has a comparison circuit unit 21, a pattern filter 22, a slow pattern detector 23a, and a fast pattern detector 23b. In addition, the CDR circuit 20 has integration circuits 24a, 24b, a counter 25, a frequency correction circuit 26, a phase detection circuit 27, a loop filter 28, and an oscillator circuit 29. It is to be noted that a circuit, which makes determination as to the value of data signal Di, is not illustrated in FIG. 3. For instance, a speculative DFE may be used as a data decision circuit.

The comparison circuit unit 21 corresponds to the comparison circuit unit 11 of the CDR circuit 10 in the first embodiment, and has comparison circuits 21a, 21b, and 21c. The comparison circuits 21a to 21c have the same function as the comparison circuits 11a to 11c of the comparison circuit unit 11 of FIG. 1. The comparison circuits 21a to 21c each output a result of comparison of the data signal Di with +Vth [V], −Vth [V], or 0 [V], for instance, at one of rising timing and falling timing of the clock signal CLK.

The pattern filter 22 corresponds to the data pattern detection circuit 12 of the CDR circuit 10 in the first embodiment, and detects an occurrence of the data pattern in which three consecutive bits of the data signal Di are 011 or 100, based on the results of comparison outputted by the comparison circuit unit 21.

In the CDR circuit 20, the same function as in the frequency detection circuit 13 of the CDR circuit 10 in the first embodiment is achieved by the slow pattern detector 23a and the fast pattern detector 23b.

When an occurrence of the above-mentioned data pattern is detected at least 3 times, the slow pattern detector 23a detects a change in the result of comparison of the data signal Di at the time of detection of the second bit of the data pattern with +Vth [V], −Vth [V], and 0 [V]. The slow pattern detector 23a then detects whether or not the frequency of the clock signal CLK outputted by the oscillator circuit 29 is lower than the frequency of the data signal Di, based on the change, and outputs a detection signal indicating a result of detection.

When an occurrence of the above-mentioned data pattern is detected at least 3 times, the fast pattern detector 23b detects a change in the result of comparison of the data signal Di at the time of detection of the second bit of the data pattern with +Vth [V], −Vth [V], and 0 [V]. The fast pattern detector 23b then detects whether or not the frequency of the clock signal CLK outputted by the oscillator circuit 29 is higher than the frequency of the data signal Di, based on the change, and outputs a detection signal indicating a result of detection.

The slow pattern detector 23a and the fast pattern detector 23b are achieved by the later-described state machine that makes state transition. The integration circuit 24a outputs the number of detection events in which the frequency of the clock signal CLK is lower than the frequency of the data signal Di in a first period. The integration circuit 24a determines the above-mentioned number (hereinafter referred to as the slow count value) by integrating the detection signal outputted by the slow pattern detector 23a.

The integration circuit 24b outputs the number of detection events in which the frequency of the clock signal CLK is higher than the frequency of the data signal Di in the first period. The integration circuit 24b determines the above-mentioned number (hereinafter referred to as the fast count value) by integrating the detection signal outputted by the fast pattern detector 23b.

The integration circuits 24a, 24b are achieved by a counter including a flip-flop and an adder, for instance.

The counter 25 outputs a reset signal for resetting the integration circuits 24a, 24b for every first period. The first period is, for instance, 32×10³ cycles in terms of the number of clock cycles of the clock signal CLK.

In the CDR circuit 20 illustrated in FIG. 3, the same function as in the adjustment circuit 14 of the CDR circuit 10 illustrated in FIG. 1 is achieved by the frequency correction circuit 26, the phase detection circuit 27, and the loop filter 28.

The frequency correction circuit 26 receives the slow count value and the fast count value outputted by the integration circuits 24a, 24b, and the detection signals outputted by the slow pattern detector 23a and the fast pattern detector 23b. The frequency correction circuit 26 outputs a signal bias to the phase detection circuit 27 based on both count values and detection signals, the signal bias indicating that the frequency of the clock signal CLK is to be advanced (increased) or the frequency of the clock signal CLK is to be delayed (decreased).

The frequency correction circuit 26 outputs a signal lock based on both count values, the signal lock indicating whether or not the frequency of the data signal Di and the frequency of the clock signal CLK are synchronized.

The phase detection circuit 27 outputs a signal UP or a signal DN based on the data signal Di and the signal bias, the signal UP for advancing the phase of the clock signal CLK, the signal DN for delaying the phase of the clock signal CLK.

The loop filter 28 filters the signals UP, DN, and generates an adjustment signal. The loop filter 28 is not limited to a digital filter, and may be a circuit that has a charge pump which adjusts a current value according to the signals UP, DN, and converts the adjusted current value to a voltage value, then outputs the voltage value as the adjustment signal.

Figure 4:
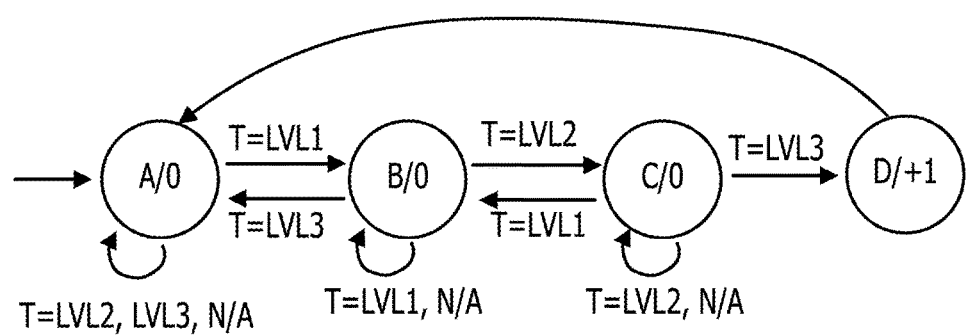
FIG. 4 illustrates an example state transition of a slow pattern detector.

The oscillator circuit 29 outputs a clock signal CLK with the phase and frequency adjusted, based on the adjustment signal outputted by the loop filter 28. FIG. 4 illustrates an example state transition of a slow pattern detector.

The slow pattern detector 23a is achieved, for instance, by a state machine that makes state transition between four states A, B, C, and D as illustrated in FIG. 4. When the processing by the slow pattern detector 23a is started (START), the slow pattern detector 23a is in state A. In state A, the detection signal outputted by the slow pattern detector 23a is 0. When the size "T" of the data signal Di at the time of detection of the second bit of a data pattern of 011 or 100 is in the voltage range of LVL1 illustrated in FIG. 1 or FIG. 2, the slow pattern detector 23a in state A makes transition to state B. When "T" is in LVL2, LVL3 illustrated in FIG. 1 or FIG. 2, or a data pattern of 011 or 100 is not detected (hereinafter referred to as N/A), the slow pattern detector 23a in state A makes no transition from state A.

In state B, the detection signal outputted by the slow pattern detector 23a is also 0. When "T" is changed to the voltage range of LVL3, the slow pattern detector 23a in state B makes transition to state A, and when "T" is changed to the voltage range of LVL2, the slow pattern detector 23a in state B makes transition to state C. When "T" is changed to the voltage range of LVL1 or in N/A, the slow pattern detector 23a in state B makes no transition from state B.

In state C, the detection signal outputted by the slow pattern detector 23a is also 0. When "T" is changed to the voltage range of LVL1, the slow pattern detector 23a in state C makes transition to state B, and when "T" is changed to the voltage range of LVL3, the slow pattern detector 23a in state C makes transition to state D. When "T" is changed to the voltage range of LVL2 or in N/A, the slow pattern detector 23a in state C makes no transition from state C.

In state D, the slow pattern detector 23a increments the detection signal by +1, and makes transition to state A. In the slow pattern detectors 23a as described above, when state transition to state D is made, 1 is outputted as a detection signal indicating that the frequency of the clock signal CLK outputted by the oscillator circuit 29 is lower than the frequency of the data signal Di.

Figure 5:
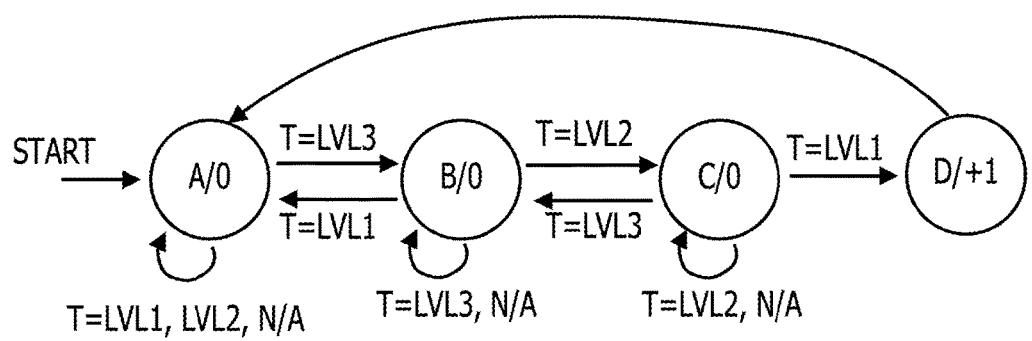
FIG. 5 illustrates an example state transition of a fast pattern detector.

FIG. 5 illustrates an example state transition of the fast pattern detector. The fast pattern detector 23b is achieved, for instance, by a state machine that makes state transition between four states A, B, C, and D as illustrated in FIG. 5.

When the processing by the fast pattern detector 23b is started (START), the fast pattern detector 23b is in state A. In state A, the detection signal outputted by the fast pattern detector 23b is 0. When the size "T" of the data signal Di at the time of detection of the second bit of a data pattern of 011 or 100 is in the voltage range of LVL3 illustrated in FIG. 1 or FIG. 2, the fast pattern detector 23b in state A makes transition to state B. When "T" is in LVL1, LVL2, or N/A illustrated in FIG. 1 or FIG. 2, the fast pattern detector 23b in state A makes no transition from state A.

In state B, the detection signal outputted by the fast pattern detector 23b is also 0. When "T" is changed to the voltage range of LVL1, the fast pattern detector 23b in state B makes transition to state A, and when "T" is changed to the voltage range of LVL2, the fast pattern detector 23b in state B makes transition to state C. When "T" is changed to the voltage range of LVL3 or in N/A, the fast pattern detector 23b in state B makes no transition from state B.

In state C, the detection signal outputted by the fast pattern detector 23b is also 0. When "T" is changed to the voltage range of LVL3, the fast pattern detector 23b in state C makes transition to state B, and when "T" is changed to the voltage range of LVL1, the fast pattern detector 23b in state C makes transition to state D. When "T" is changed to the voltage range of LVL2 or in N/A, the fast pattern detector 23b in state C makes no transition from state C.

In state D, the fast pattern detector 23b increments the detection signal by +1, and makes transition to state A. In the fast pattern detectors 23b as described above, when state transition to state D is made, 1 is outputted as a detection signal indicating that the frequency of the clock signal CLK outputted by the oscillator circuit 29 is higher than the frequency of the data signal Di.

Figure 6:
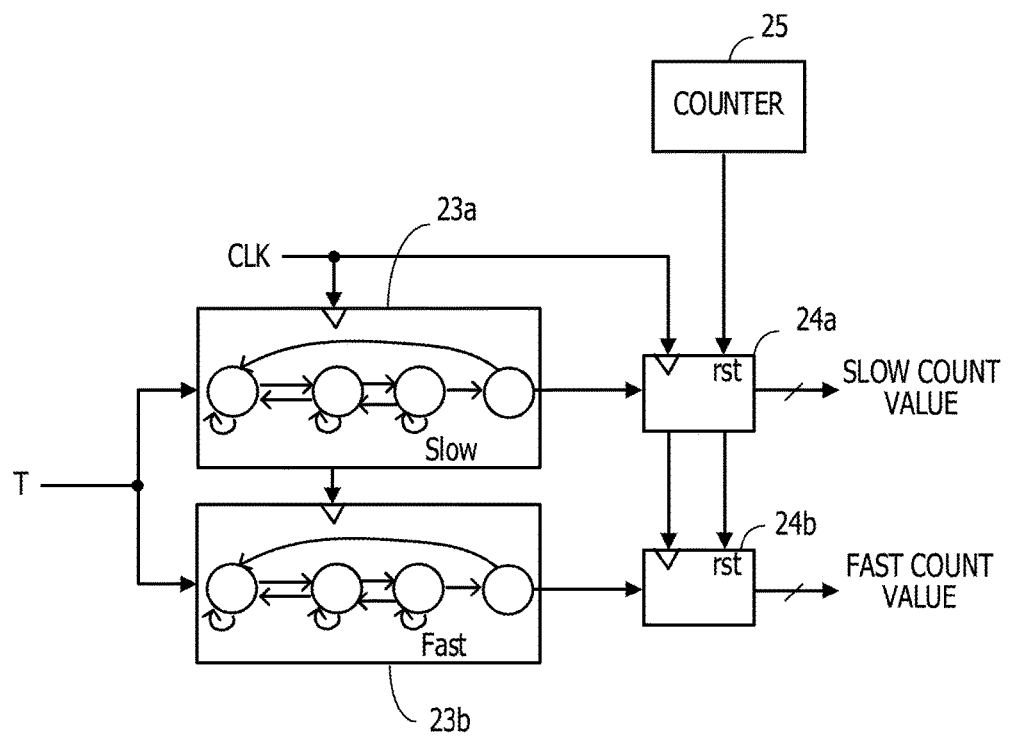
FIG. 6 illustrates an example integration circuit.

FIG. 6 illustrates an example integration circuit. For instance, as illustrated in FIG. 6, the integration circuit 24a outputs a slow count value by integrating the detection signal outputted by the slow pattern detector 23a in synchronization with the clock signal CLK.

For instance, as illustrated in FIG. 6, the integration circuit 24b outputs a fast count value by integrating the detection signal outputted by the fast pattern detector 23b in synchronization with the clock signal CLK.

Also, the integration circuits 24a, 24b each have reset a terminal rst, and periodically resets the slow count value and the fast count value to 0 by a reset signal outputted by the counter 25. Although illustration has been omitted in FIGS. 4 and 5, the slow pattern detector 23a and the fast pattern detector 23b also make state transition in synchronization with the clock signal CLK.

The frequency correction circuit 26 outputs a signal lock based on the slow count value and the fast count value. In addition, the frequency correction circuit 26 outputs a signal bias based on the detection signal outputted by the slow pattern detector 23a and the fast pattern detector 23b.

When the frequency of the clock signal CLK and the frequency of the data signal Di are synchronized, the change in the size "T" of the data signal Di at the time of detection of the second bit of a data pattern of 011 or 100 is small. Thus, both the slow count value and the fast count value are quite small. Therefore, a result of comparison of the sum value of the slow count value and the fast count value with a first threshold value can be used as a criterion for determining whether or not the frequencies are synchronized.

The slow count value and the fast count value may be increased due to the effect of jitter which is a sine wave with a high frequency. When a jitter occurs with the data signal Di and the clock signal CLK synchronized, the slow count value and the fast count value have substantially the same value. Therefore, a result of comparison of the second threshold value with the absolute value of a result of subtraction between the slow count value and the fast count value can be used as a criterion for determining whether or not a frequency drift has occurred or a jitter has occurred. The frequency correction circuit 26 has a frequency synchronization detection unit that outputs a signal lock based on such a determination criteria.

Figure 7:
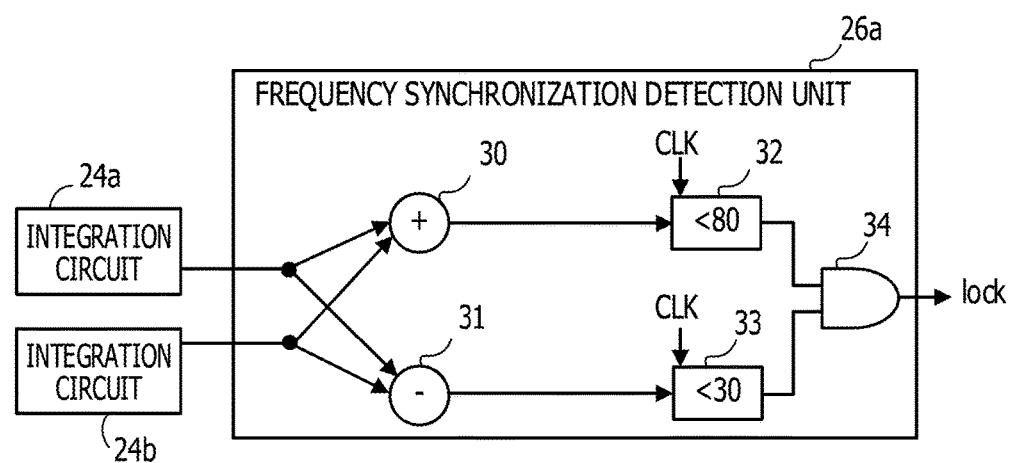
FIG. 7 illustrates an example frequency synchronization detection unit.

FIG. 7 illustrates an example frequency synchronization detection unit. The frequency synchronization detection unit 26a has an adder 30, a subtracter 31, comparison circuits 32, 33, and an AND circuit 34.

The adder 30 outputs a result of addition between the slow count value outputted by the integration circuit 24a and the fast count value outputted by integration circuit 24b. The subtracter 31 outputs a result of subtraction between the slow count value and the fast count value.

The comparison circuit 32 synchronizes with the clock signal CLK, and compares an addition result outputted by the adder 30 with the first threshold value (80 in the example of FIG. 7) for every certain period (for instance, 32 μsec). When the addition result is less than the first threshold value, the comparison circuit 32 outputs 1, and when the addition result is greater than or equal to than the first threshold value, the comparison circuit 32 outputs 0.

The comparison circuit 33 synchronizes with the clock signal CLK, and compares the absolute value of a subtraction result outputted by the subtracter 31 with the second threshold value (30 in the example of FIG. 7) for every certain period (for instance, 32 μsec). When the absolute value of the subtraction result is less than the second threshold value, the comparison circuit 33 outputs 1, and when the absolute value of the subtraction result is greater than or equal to the second threshold value, the comparison circuit 33 outputs 0.

When both the output signals of the comparison circuits 32, 33 are 1, the AND circuit 34 outputs 1 as a signal lock indicating that the frequency of the clock signal CLK and the frequency of the data signal Di are synchronized. When at least one of the output signals of the comparison circuits 32, 33 is 0, the AND circuit 34 outputs 0 as a signal lock indicating that the frequency of the clock signal CLK and the frequency of the data signal Di are not synchronized.

The first threshold value and the second threshold value are not limited to the above-mentioned example. The frequency correction circuit 26 has a bias signal generation unit that generates a signal bias in consideration of jitter.

Figure 8:
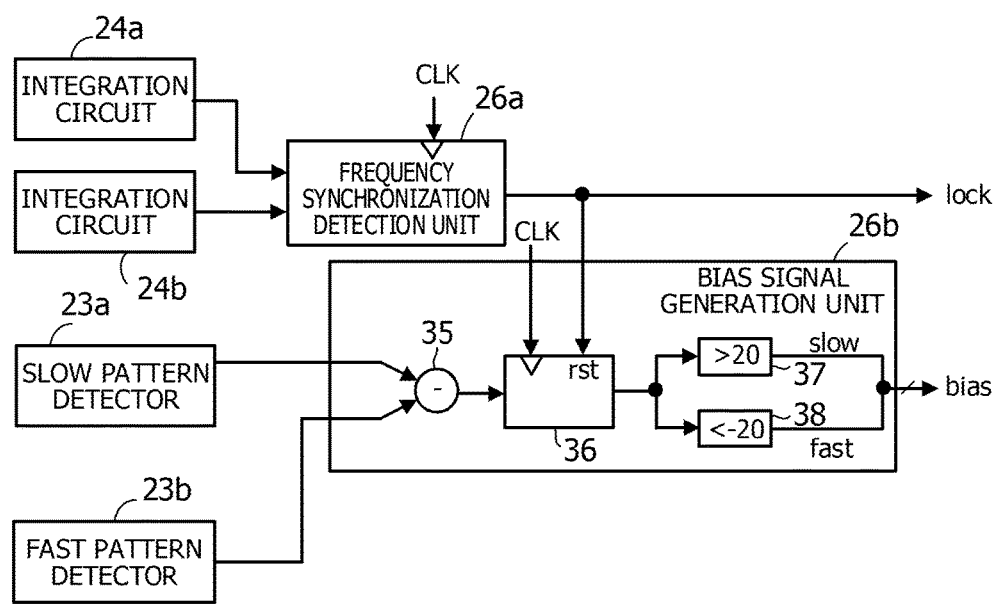
FIG. 8 illustrates an example bias signal generation unit.

FIG. 8 illustrates an example bias signal generation unit. The bias signal generation unit 26b has a subtracter 35, an integration circuit 36, and comparison circuits 37, 38.

The subtracter 35 outputs a result of subtraction between a detection signal outputted by the slow pattern detector 23a, and a detection signal outputted by the fast pattern detector 23b. The integration circuit 36 integrates the result of subtraction outputted by the subtracter 35 in synchronization with the clock signal CLK. It is to be noted that the integration circuit 36 has a reset terminal rst, and when signal lock outputted by the frequency synchronization detection unit 26a is 1, the integration circuit 36 resets an integrated value to 0.

The comparison circuit 37 compares an integrated value with the third threshold value (20 in the example of FIG. 8), and when the integrated value is greater than the third threshold value, the comparison circuit 37 outputs a signal bias indicating that the frequency of the clock signal CLK is low.

The comparison circuit 38 compares an integrated value with the fourth threshold value (−20 in the example of FIG. 8), and when the integrated value is less than the fourth threshold value, the comparison circuit 38 outputs a signal bias indicating that the frequency of the clock signal CLK is high.

For instance, the signal bias is a 2-bit signal, and when the integrated value is greater than the third threshold value, the signal bias may be "01", when the integrated value is less than the fourth threshold value, the signal bias may be "10", and when the fourth threshold value the integrated value third threshold value, the signal bias may be "00".

The bias signal generation unit 26b like this can reduce occurrence of frequency adjustment by mistake due to jitter by outputting the signal bias according to a result of comparison of the third threshold value or the fourth threshold value with the integrated value.

Figure 9:
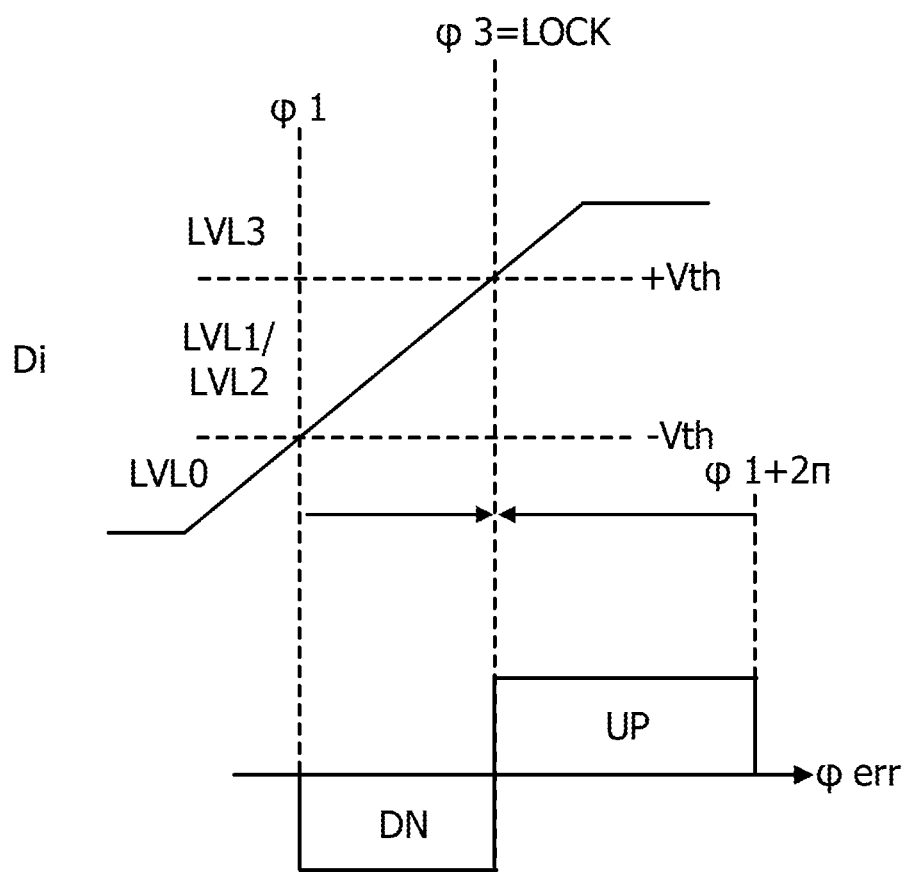
FIG. 9 illustrates an example operation of a phase detection circuit at the time of frequency synchronization.

It is to be noted that the third threshold value and the fourth threshold value are not limited to the above-mentioned example. FIG. 9 illustrates an example operation of a phase detection circuit at the time of frequency synchronization.

FIG. 9 illustrates an operation example of the phase detection circuit 27 when an occurrence of the data pattern of 011 is detected. When the frequency of the clock signal CLK is synchronized with the frequency of the data signal Di (for instance, when the signal bias is "00"), the phase detection circuit 27 outputs the signals UP, DN to achieve phase synchronization at the timing when the phase of the data signal Di becomes $\varphi 3$. $\varphi 3$ is the phase at which the data signal Di is +Vth [V].

As illustrated in FIG. 9, when a phase error $\varphi err$ is greater than or equal to $\varphi 1$ and less than $\varphi 3$, the phase detection circuit 27 outputs the signal DN. $\varphi 1$ is the phase at which the data signal Di is −Vth [V]. Also, when the phase error $\varphi err$ is greater than $\varphi 3$ and less than or equal to $\varphi 1+2\pi$, the phase detection circuit 27 outputs the signal UP.

In order to detect such a phase error $\varphi err$, the phase detection circuit 27 has the functions of the comparison circuit unit 21 and the pattern filter 22, for instance. When the data pattern of 011 occurs and the voltage range of the size of the data signal Di at the time of sampling the second bit of the data pattern is in LVL1, or LVL2 (corresponding the case where the phase error $\varphi err$ is greater than or equal to $\varphi 1$ and less than $\varphi 3$), the phase detection circuit 27 outputs the signal DN. Also, when the voltage range is in LVL3 (corresponding the case where the phase error $\varphi err$ is greater than $\varphi 3$ and less than or equal to $\varphi 1+2\pi$), the phase detection circuit 27 outputs the signal UP.

Figure 10:
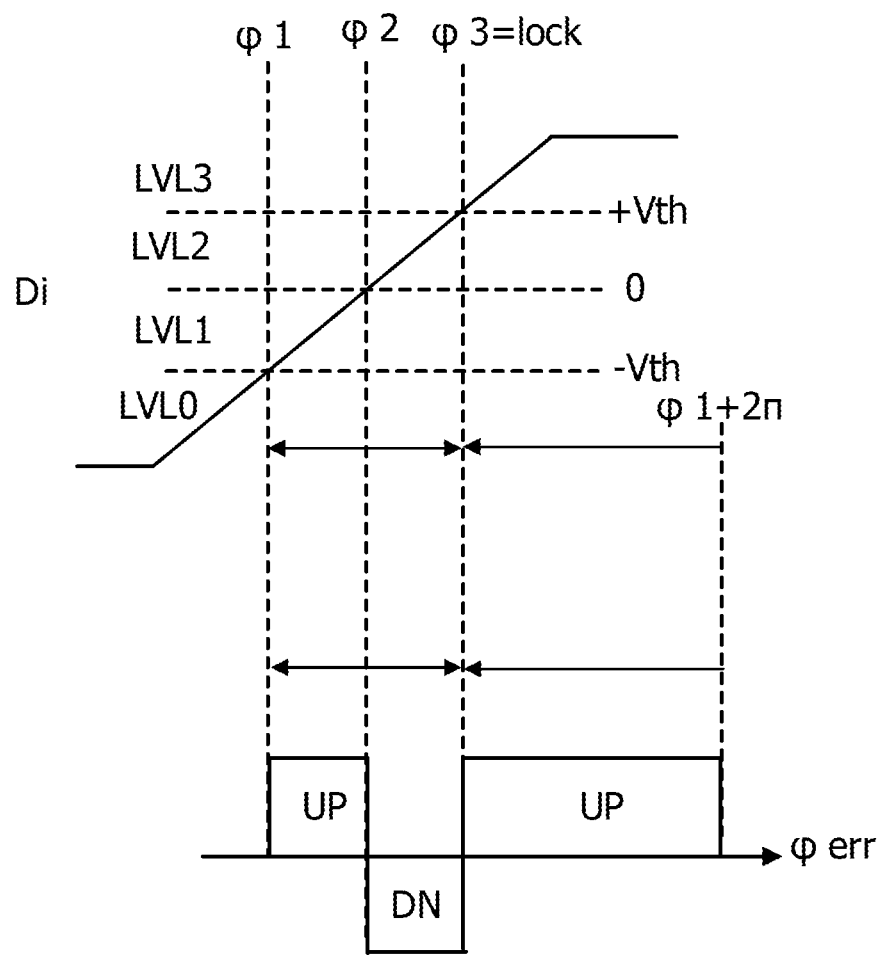
FIG. 10 illustrates an example operation when the frequency of the clock signal CLK is low.

FIG. 10 illustrates an example operation when the frequency of the clock signal CLK is low. When the frequency of the clock signal CLK is lower than the frequency of the data signal Di (for instance, when the signal bias is "01"), the phase detection circuit 27 outputs the signals UP, DN to achieve phase synchronization at the timing when the phase of the data signal Di reaches $\varphi 3$.

As illustrated in FIG. 10, when the phase error φerr is greater than or equal to φ1 and less than φ2, the phase detection circuit 27 outputs the signal UP. φ2 is the phase at which the data signal Di is 0 [V]. Also, when the phase error φerr is greater than or equal to φ2 and less than φ3, the phase detection circuit 27 outputs the signal DN. Also, when the phase error φerr is greater than φ3 and less than or equal to φ1+2π, the phase detection circuit 27 outputs the signal UP.

For instance, when the data pattern of 011 occurs and the voltage range of the size of the data signal Di at the time of sampling the second bit of the data pattern is in LVL1 (corresponding the case where the phase error φerr is greater than or equal to φ1 and less than φ2), the phase detection circuit 27 outputs the signal UP. Also, when the voltage range is in LVL2 (corresponding the case where the phase error φerr is greater than or equal to φ2 and less than φ3), the phase detection circuit 27 outputs the signal DN. Also, when the voltage range is in LVL3 (corresponding the case where the phase error φerr is greater than φ3 and less than or equal to φ1+2π), the phase detection circuit 27 outputs the signal UP.

In this manner, when the frequency of the clock signal CLK is lower than the frequency of the data signal Di, the phase detection circuit 27 sets the rate of output of the signal UP per unit time (for instance, one cycle of the clock signal CLK) higher than the rate of output of the signal DN per unit time. Consequently, the frequency of the clock signal can be increased.

Figure 11:
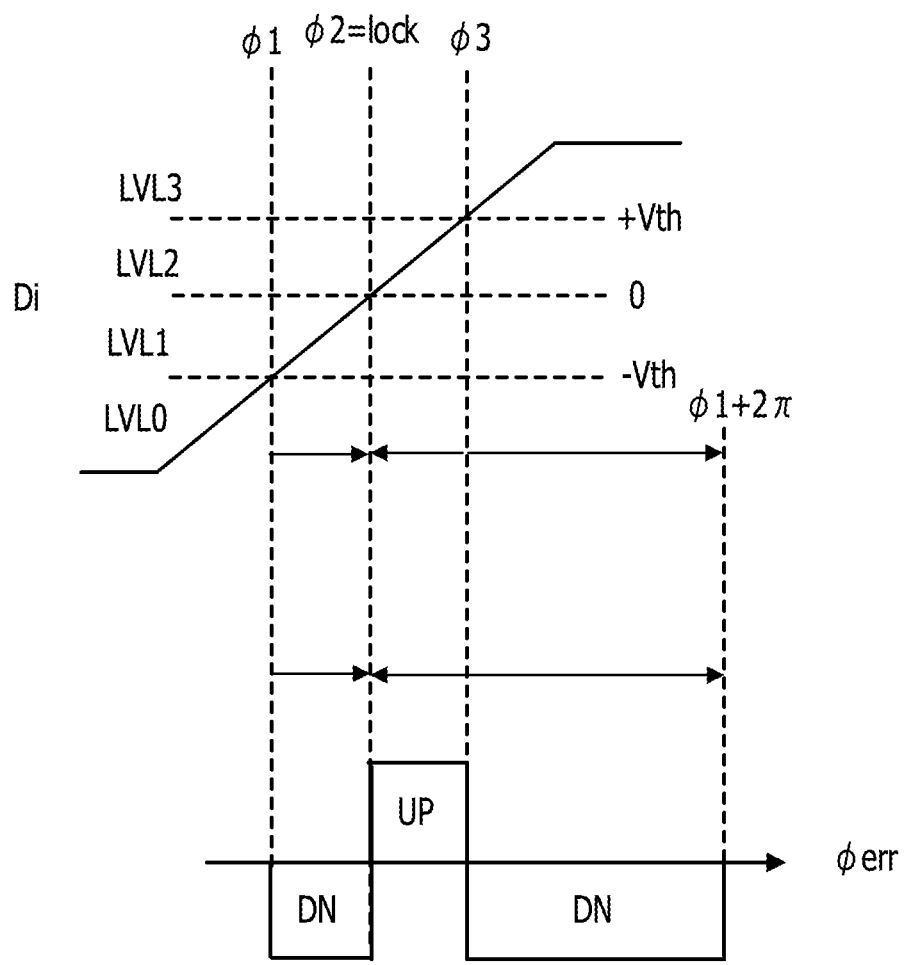
FIG. 11 illustrates an example operation when the frequency of the clock signal CLK is high.

FIG. 11 illustrates an example operation when the frequency of the clock signal CLK is high. When the frequency of the clock signal CLK is higher than the frequency of the data signal Di (for instance, when the signal bias is "10"), the phase detection circuit 27 outputs the signals UP, DN to achieve phase synchronization at the timing when the phase of the data signal Di reaches φ2.

As illustrated in FIG. 11, when the phase error φerr is greater than or equal to φ1 and less than φ2, the phase detection circuit 27 outputs the signal DN. Also, when the phase error φerr is greater than or equal to φ2 and less than φ3, the phase detection circuit 27 outputs the signal UP. Also, when the phase error φerr is greater than φ3 and less than or equal to φ1+2π, the phase detection circuit 27 outputs the signal DN.

For instance, when the data pattern of 011 occurs and the voltage range of the size of the data signal Di at the time of sampling the second bit of the data pattern is in LVL1 (corresponding the case where the phase error φerr is greater than or equal to φ1 and less than φ2), the phase detection circuit 27 outputs the signal DN. Also, when the voltage range is in LVL2 (corresponding the case where the phase error φerr is greater than or equal to φ2 and less than φ3), the phase detection circuit 27 outputs the signal UP. Also, when the voltage range is in LVL3 (corresponding the case where the phase error φerr is greater than φ3 and less than or equal to φ1+2π), the phase detection circuit 27 outputs the signal DN.

In this manner, when the frequency of the clock signal CLK is higher than the frequency of the data signal Di, the phase detection circuit 27 sets the rate of output of the signal UP per unit time (for instance, one cycle of the clock signal CLK) lower than the rate of output of the signal DN per unit time. Consequently, the frequency of the clock signal can be decreased.

Figure 12:
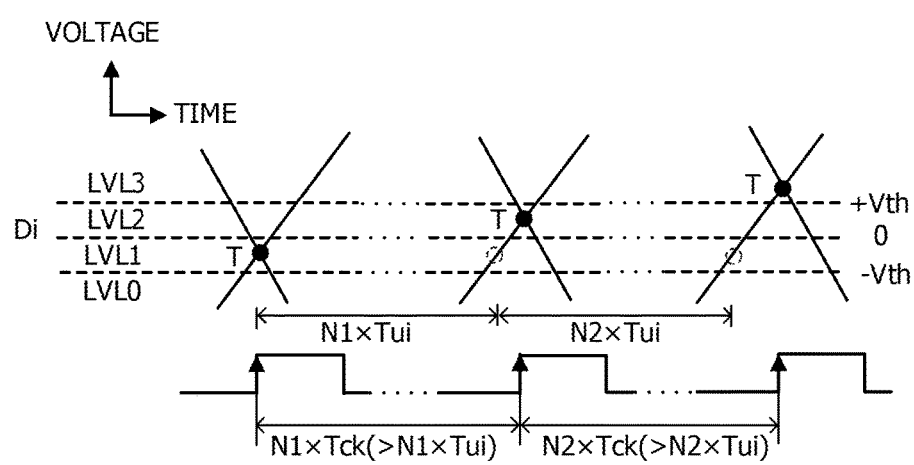
FIG. 12 illustrates an example change in "T" when the frequency of the clock signal CLK is lower than the frequency of the data signal Di.

FIG. 12 illustrates an example change in "T" when the frequency of the clock signal CLK is higher than the frequency of the data signal Di.

FIG. 12 illustrates the situation of an example change in the size "T" of the second bit of the data signal Di when three consecutive bits of the data signal Di have a data pattern of 011 or 100. The vertical axis indicates voltage and the horizontal axis indicates time. In FIG. 12, Tui indicates the period of one UI of the data signal Di, Tck indicates the cycle of the clock signal CLK, and N1, N2 indicate any values.

An upward slope or a downward slope is formed in a received waveform of the data signal Di having a certain data pattern due to the effect of ISI. For instance, an upward slope is formed in a received waveform of the data signal Di having a data pattern of 011, and a downward slope is formed in a received waveform of the data signal Di having a data pattern of 100.

When the frequency of clock signal CLK is lower than the frequency of the data signal Di, the size "T" of the data signal Di of the second bit of the data pattern sampled in a portion of an upward slope or a downward slope is increased as time elapses. In the example of FIG. 12, "T", which is in the voltage range of LVL1 at first, is moved into the voltage range of LVL2 after N1×Tck, and is further moved into the voltage range of LVL3 after N2×Tck. At this point, N1×Tck>N1×Tui, and N2×Tck>N2×Tui are satisfied.

In this case, as in the state transition diagram illustrated in FIG. 4, the slow pattern detector 23a makes transition in the order of state A, state B, state C, and state D, and thus the detection signal is set to +1. Accordingly, the slow count value outputted by the integration circuit 24a is incremented.

Figure 13:
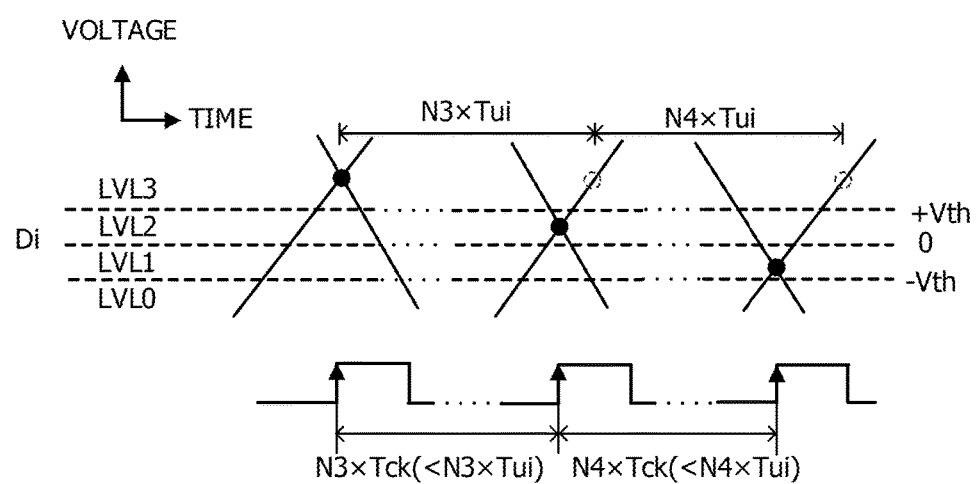
FIG. 13 illustrates an example change in "T" when the frequency of the clock signal CLK is higher than the frequency of the data signal Di.

FIG. 13 illustrates an example change in "T" when the frequency of the clock signal CLK is higher than the frequency of the data signal Di. N3, N4 indicate any values. When the frequency of clock signal CLK is higher than the frequency of the data signal Di, the size "T" of the data signal Di of the second bit of the data pattern sampled in a portion of an upward slope or a downward slope is decreased as time elapses. In the example of FIG. 13, "T", which is in the voltage range of LVL3 at first, is moved into the voltage range of LVL2 after N3×Tck, and is further moved into the voltage range of LVL1 after N4×Tck. At this point, N3×Tck<N3×Tui, and N4×Tck <N4×Tui are satisfied.

In this case, as in the state transition diagram illustrated in FIG. 5, the fast pattern detector 23b makes transition in the order of state A, state B, state C, and state D, and thus the detection signal is set to +1. Accordingly, the fast count value outputted by the integration circuit 24b is incremented.

The frequency correction circuit 26 receives the slow count value and the fast count value outputted by the integration circuits 24a, 24b, and the detection signals outputted by the slow pattern detector 23a and the fast pattern detector 23b. For instance, as illustrated in FIG. 7, when the sum value of the slow count value and the fast count value is greater than or equal to 80, or the difference value between the slow count value and the fast count value is greater than or equal to 30, the frequency synchronization detection unit 26a of the frequency correction circuit 26 sets the signal lock to 0. When the sum value of the slow count value and the fast count value is less than 80, or the difference value between the slow count value and the fast count value is less than 30, the frequency synchronization detection unit 26a sets the signal lock to 1.

When the signal lock is 0, for instance, as illustrated in FIG. 8, when the integrated value outputted by the integration circuit 36 is greater than 20, the bias signal generation unit 26b of the frequency correction circuit 26 outputs a signal bias indicating that the frequency of the clock signal CLK is low. When the integrated value outputted by the integration circuit 36 is less than −20, the bias signal generation unit 26b outputs a signal bias indicating that the frequency of the clock signal CLK is high.

As illustrated in FIG. 10 or FIG. 11, the phase detection circuit 27 outputs a signal UP or a signal DN based on the data signal Di and the signal bias, the signal UP for advancing the phase of the clock signal CLK, the signal DN for delaying the phase of the clock signal CLK.

The loop filter 28 filters the signals UP, DN, and generates an adjustment signal. The oscillator circuit 29 outputs a clock signal CLK with the phase and frequency adjusted, based on the adjustment signal outputted by the loop filter 28.

On the other hand, when the signal lock is 1, the bias signal generation unit 26b of the frequency correction circuit 26 outputs, for instance, "00" as the signal bias. At this point, as illustrated in FIG. 9, the phase detection circuit 27 outputs a signal UP or a signal DN, and corrects the deviation of the phase of clock signal CLK with respect to the phase of the data signal Di.

Figure 14:
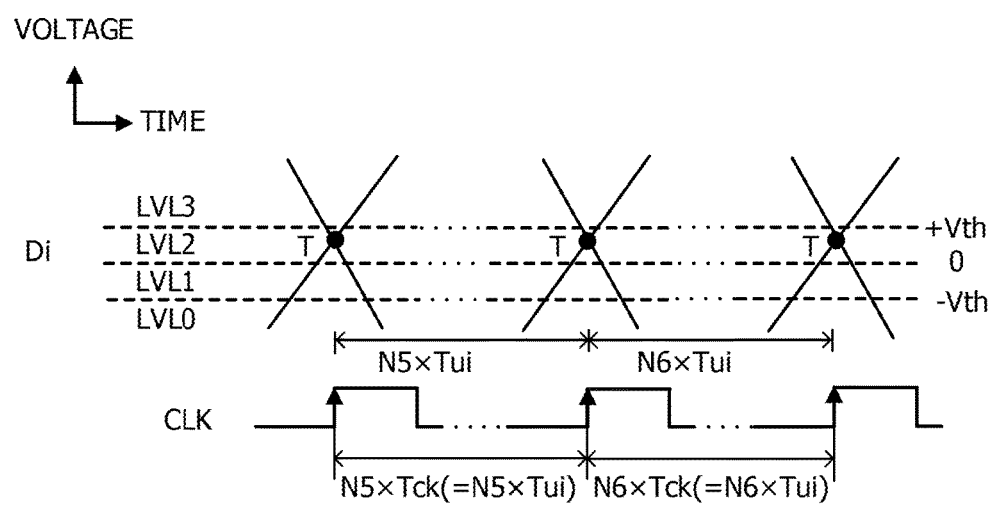
FIG. 14 illustrates example data signal and clock signal at the time of frequency synchronization.

FIG. 14 illustrates example data signal and clock signal at the time of frequency synchronization. N5, N6 are predetermined values. When the frequency of the data signal Di and the frequency of the clock signal CLK are synchronized, the size "T" of the data signal Di sampled in a portion of an upward slope or a downward slope has the same value each time a data pattern of 011 or 100 is detected. In the example of FIG. 14, the size "T" stays in the voltage range of LVL2. At this point, N5×Tck=N5×Tui and N6×Tck=N6×Tui.

As described above, the CDR circuit 20 in the second embodiment detects a data pattern of 011 or 100, and performs frequency detection based on the change in the result of comparison of the data signal Di at the time of sampling the second bit of the data pattern with three threshold values. Thus, the frequency detection can be performed by CDR circuit 10 based on the baud rate, and the number of clock signals generated for frequency detection can be reduced, as compared with the case of a CDR circuit in relate art, and thus the number of comparison circuits is reduced, and the area of the circuits can be reduced. Since the circuit area can be reduced, reduction of the power consumption associated with the operation of the circuits is also possible.

Also, the phase detection circuit 27 changes the rate of output of the signal DN and the rate of output of the signal UP per unit time based on the signal bias, thereby increasing or decreasing the frequency of the clock signal. When a circuit unit that performs frequency adjustment and a circuit unit which performs phase adjustment are separately provided the circuits interfere with each other and adjustment accuracy deteriorates. However, in the CDR circuit 20 in this embodiment, the frequency adjustment and the phase adjustment can be performed without interference by providing the phase detection circuit 27 as described above. Thus, it is possible to perform frequency adjustment and phase adjustment with high accuracy.

Figure 15:
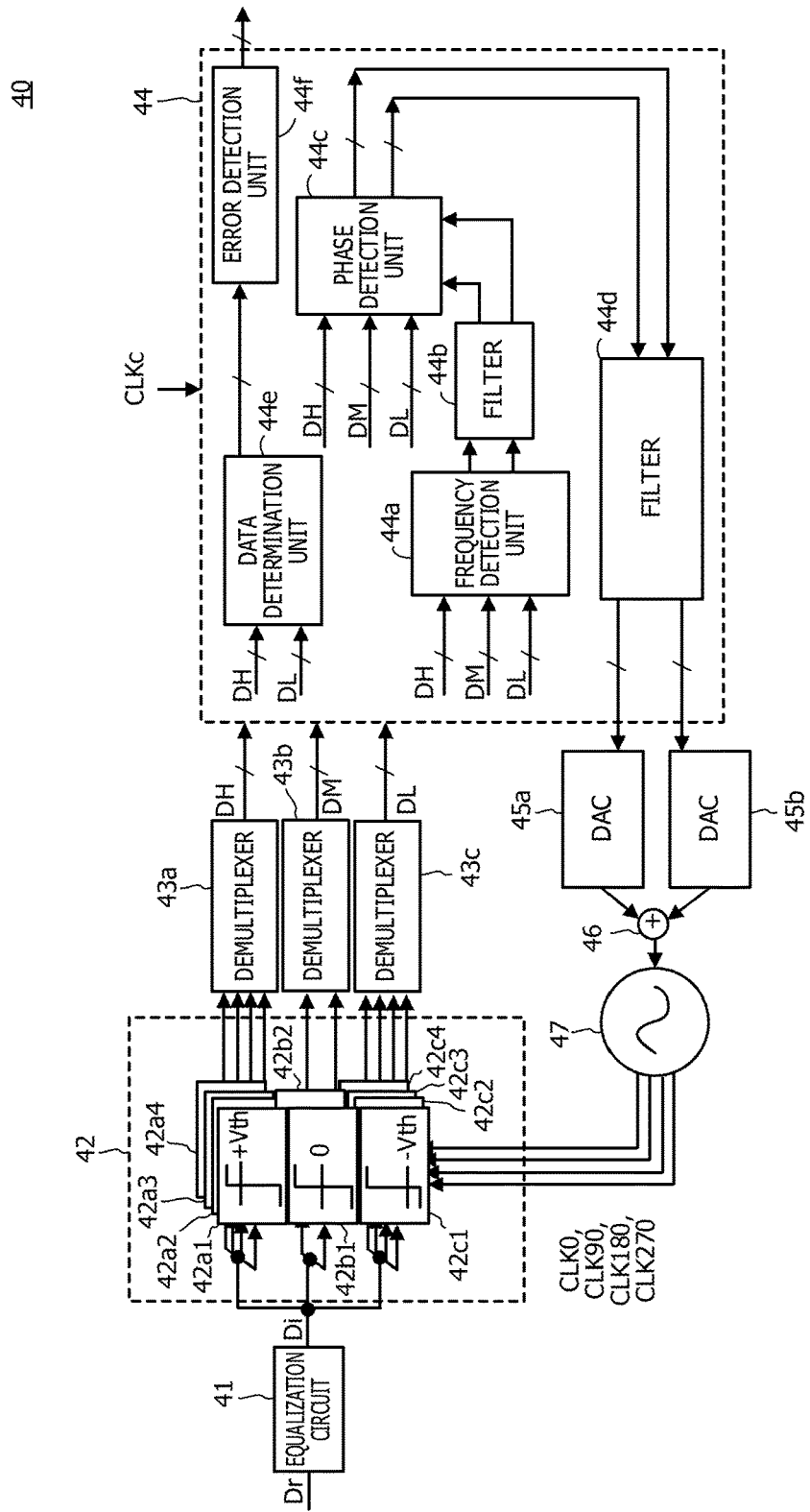
FIG. 15 illustrates an example receiving circuit.

FIG. 15 illustrates an example receiving circuit. The receiving circuit 40 includes a function of performing CDR without a reference clock. In contrast to the CDR circuit 20 in the second embodiment, the receiving circuit 40 has a circuit configuration in which an interleaved operation is performed in 4 parallels using four-phase clock signals CLK0, CLK90, CLK180, CLK270 with any adjacent phases having 90 degree difference. For instance, when the data rate of a data signal Dr received by the receiving circuit 40 is 28 Gb/s, the frequency of the clock signals CLK0 to CLK270 can be bounded within 7 GHz by processing the data signal Dr in four parallels.

The number of parallels is not limited to four. A circuit configuration for performing an interleaved operation in five or more parallels can be adopted by increasing the phase of clock signals to be generated. The receiving circuit 40 has an equalization circuit 41, a comparison circuit unit 42, demultiplexers 43a, 43b, 43c, a digital logic circuit 44, digital to analog converter (DAC) circuits 45a, 45b, an adder 46, and an oscillator circuit 47.

The equalization circuit 41 receives a data signal Dr and performs equalization processing on the data signal Dr and outputs a data signal Di. For instance, a continuous-time linear equalizer (CTLE) can be used as the equalization circuit 41.

The comparison circuit unit 42 has four comparison circuits 42a1, 42a2, 42a3, and 42a4, and four comparison circuits 42c1, 42c2, 42c3, and 42c4 provided corresponding to four-phase clock signals CLK0 to CLK270, respectively. In addition, the comparison circuit unit 42 has comparison circuits 42b1, and 42b2 provided corresponding to two of the clock signals CLK0 to CLK270.

The comparison circuit 42a1 outputs a result of comparison between +Vth [V] and the data signal Di in synchronization with one of rising timing and falling timing of the clock signal CLK0. The comparison circuit 42a2 outputs a result of comparison between +Vth [V] and the data signal Di in synchronization with one of rising timing and falling timing of the clock signal CLK90. The comparison circuit 42a3 outputs a result of comparison between +Vth [V] and the data signal Di in synchronization with one of rising timing and falling timing of the clock signal CLK180. The comparison circuit 42a4 outputs a result of comparison between +Vth [V] and the data signal Di in synchronization with one of rising timing and falling timing of the clock signal CLK270.

The comparison circuit 42c1 outputs a result of comparison between −Vth [V] and the data signal Di in synchronization with one of rising timing and falling timing of the clock signal CLK0. The comparison circuit 42c2 outputs a result of comparison between −Vth [V] and the data signal Di in synchronization with one of rising timing and falling timing of the clock signal CLK90. The comparison circuit 42c3 outputs a result of comparison between −Vth [V] and the data signal Di in synchronization with one of rising timing and falling timing of the clock signal CLK180. The comparison circuit 42c4 outputs a result of comparison between −Vth [V] and the data signal Di in synchronization with one of rising timing and falling timing of the clock signal CLK270.

The comparison circuit 42b1 outputs a result of comparison between 0 [V] and the data signal Di in synchronization with one of rising timing and falling timing of one (for instance, the clock signal CLK0) of the clock signals CLK0 to CLK270. The comparison circuit 42b2 outputs a result of comparison between 0 [V] and the data signal Di in synchronization with one of rising timing and falling timing of one (for instance, the clock signal CLK180) of the clock signals CLK0 to CLK270.

In the example of the receiving circuit 40 of FIG. 15, in order to reduce the circuit area and the power consumption, the number of comparison circuits 42b1, 42b2 used for frequency detection is two. However, the number of comparison circuits may be three or four, or may be one.

The demultiplexers 43a to 43c demultiplex the comparison results according to the frequency of an operation clock signal CLKc of the digital logic circuit 44 so that the digital logic circuit 44 can process the comparison results. Hereinafter, a description is given under the assumption that the frequency of the operation clock signal CLKc is 875 MHz as an example.

The demultiplexer 43a receives a 1-bit comparison result outputted by each of the comparison circuits 42a1 to 42a4, and demultiplexes a 4-bit comparison result to 32-bit signal, and outputs the 32-bit signal as the signal DH. The demultiplexer 43b receives a 1-bit comparison result outputted by each of the comparison circuits 42b1, 42b2, and demultiplexes a 2-bit comparison result to 16-bit signal, and outputs the 16-bit signal as the signal DM. The demultiplexer 43c receives a 1-bit comparison result outputted by each of the comparison circuits 42c1 to 42c4, and demultiplexes a 4-bit comparison result to 32-bit signal, and outputs the 32-bit signal as the signal DL.

The digital logic circuit 44 has a frequency detection unit 44a, a filter 44b, a phase detection unit 44c, a filter 44d, a data determination unit 44e, and an error detection unit 44f. The frequency detection unit 44a includes the function of the pattern filter 22, the slow pattern detector 23a, the fast pattern detector 23b, and the integration circuits 24a, 24b illustrated in FIG. 3. The frequency detection unit 44a receives signals DH, DM, and DL as the comparison results, and detects an occurrence of the data pattern in which three consecutive bits of the data signal Di are 011 or 100, based on the signals DH, DM, and DL. When an occurrence of the above-mentioned data pattern is detected at least 3 times, the frequency detection unit 44a detects a change in the result of comparison of the data signal Di at the time of detection of the second bit of the data pattern with +Vth [V], −Vth [V], and 0 [V]. The frequency detection unit 44a then outputs detection signals based on the change, the detection signals indicating that each of the frequencies of the clock signals CLK0 to CLK270 is lower than, higher than, or synchronized with the frequency of the data signal Di.

The frequency detection unit 44a outputs an integrated value (slow count value) of the number of output of a detection signal indicating that one of the frequencies of the clock signals CLK0 to CLK270 is lower than the frequency of the data signal Di. In addition, the frequency detection unit 44a outputs an integrated value (fast count value) of the number of output of a detection signal indicating that one of the frequencies of the clock signals CLK0 to CLK270 is higher than the frequency of the data signal Di. It is to be noted that the integrated value is reset at a predetermined period.

The detection signal and the integrated value undergo the filtering processing by the filter 44b, and are supplied to the phase detection unit 44c. The phase detection unit 44c includes the functions of the frequency correction circuit 26 and the phase detection circuit 27 illustrated in FIG. 3. The phase detection unit 44c determines based on the detection signal and the integrated value whether the frequency of the clock signals CLK0 to CLK270 is to be advanced (increased) or the frequency of the clock signals CLK0 to CLK270 is to be delayed (decreased). Also, the phase detection unit 44c determines based on the integrated value whether or not the frequency of the data signal Di and the frequency of the clock signals CLK0 to CLK270 are synchronized.

The phase detection unit 44c outputs a signal UP or a signal DN based on the determination and the signals DH, DM, and DL, the signal UP for advancing the phase of the clock signals CLK0 to CLK270, the signal DN for delaying the phase of the clock signals CLK0 to CLK270. The signals UP, DN are 5 bits, for instance.

The filter 44d is, for instance, a digital loop filter, and filters the signal UP, DN and generates an adjustment signal. In the example of FIG. 15, the filter 44d outputs an adjustment signal (for instance, a 5-bit signal) for coarse adjustment, and an adjustment signal (for instance, a 6-bit signal) for fine adjustment.

The data determination unit 44e outputs a result of determination as to the value of the data signal Di based on the signal DH, DL. The data determination unit 44e is, for instance, a speculative DFE. When the previous determination result is 1, the data determination unit 44e outputs a result of determination as to the value of the data signal Di based on the signal DH, and when the previous determination result is 0, the data determination unit 44e outputs a result of determination as to the value of the data signal Di based on the signal DL.

The error detection unit 44f compares the result of determination as to the value of the data signal Di with an expected value, for instance, and when the result of determination is different from the expected value, the error detection unit 44f outputs a signal indicating that an error has occurred.

The DAC 45a converts an adjustment signal for coarse adjustment outputted by the filter 44d into an analog signal. The DAC 45b converts an adjustment signal for fine adjustment outputted by the filter 44d into an analog signal.

The adder 46 outputs a result of addition of analog signals outputted by the DACs 45a, 45b. The oscillator circuit 47 outputs clock signals CLK0 to CLK270 with the phase and frequency adjusted, based on the result of addition outputted by the adder 46.

An example of result of simulation to verify the operation of the receiving circuit 40 as described above is presented in the following. In the example of result of simulation below, it is assumed that bit error rate is $1\times10^{-6}$, and phase noise of −78 dBc/MHz occurs per offset of 1 MHz in the oscillator circuit 47. Also, the threshold noise of the comparison circuits 42a1 to 42a4, 42b1, 42b2, 42c1 to 42c4 is assumed to be 10 mVpp for the above-mentioned bit error rate.

Figure 16:
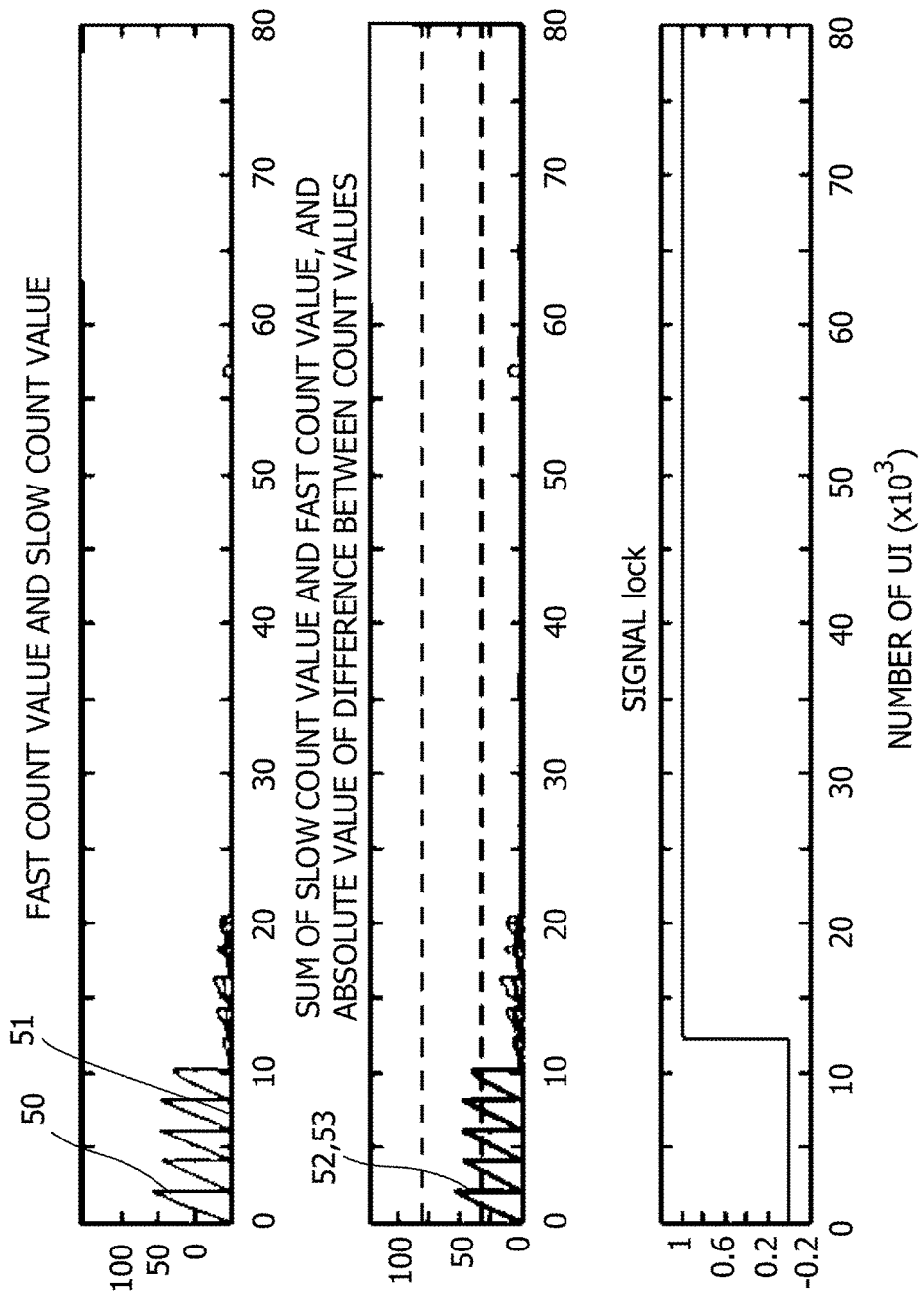
FIG. 16 illustrates an example simulation result when a jitter with a relatively small amplitude occurs.
Figure 17:
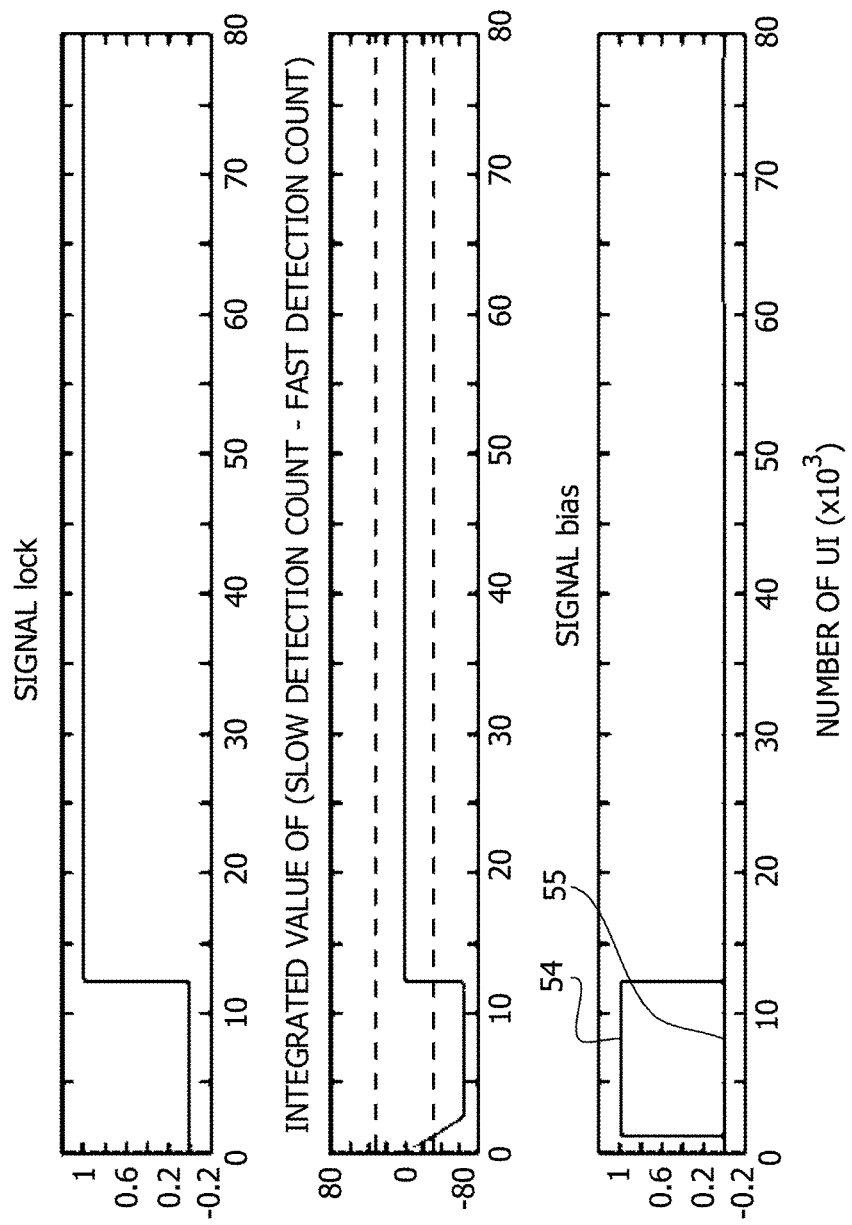
FIG. 17 illustrates an example simulation result when a jitter with a relatively small amplitude occurs.

FIGS. 16 and 17 each illustrate an example simulation result when a jitter with a relatively small amplitude occurs. The horizontal axis indicates the number of UI ($\times10^3$). In FIGS. 16 and 17, it is assumed that jitter with an amplitude of 0.1 UIpp has occurred per 1 GHz in the data signal Di having a data rate of 28 Gb/s, and the initial value of the frequency of the clock signals CLK0 to CLK270 is higher than 7 GHz.

FIG. 16 illustrates the situation of a fast count value (waveform 50), a slow count value (waveform 51), the sum (waveform 52) of the slow count value and the fast count value, the absolute value (waveform 53) of the difference, and the signal lock. Also, FIG. 17 illustrates the situation of the signal lock, the integrated value (corresponding to the output of the integration circuit 36 in FIG. 8) of (the slow detection count−the fast detection count), and the signal bias (waveforms 54, 55).

Since the initial value of the frequency of the clock signals CLK0 to CLK270 is higher than 7 GHz which is ¼ the frequency 28 Gb/s of the data signal Di, the fast count value repeats ascending and descending in a predetermined cycle like the waveform 50. In contrast, the slow count value is substantially 0 like the waveform 51.

The sum of the slow count value and the fast count value, and the absolute value of the difference between the count values are substantially the same like the waveforms 52, 53.

The sum of the slow count value and the fast count value, and the absolute value of the difference between the count values are compared with 30 and 80 in the predetermined cycle by the function of the frequency synchronization detection unit 26a illustrated in FIG. 7. As illustrated in FIG. 16, up to a number near $10 \times 10^3$ UI, the sum of the slow count value and the fast count is less than 80, however the absolute value of the difference exceeds 30, thus as the signal lock, 0 is outputted which indicates that frequency synchronization is not achieved.

At this point, the integrated value of (the slow detection count−the fast detection count) increases to the negative side, and becomes less than −20, thus the bit of the signal bias indicated by the waveform 54 is 1, the signal bias indicating that the frequency of the clock signals CLK0 to CLK270 is high. In contrast, the bit of the signal bias indicated by the waveform 55 is 0, the signal bias indicating that the frequency of the clock signals CLK0 to CLK270 is low.

Thus, adjustment is made so that the frequency of the clock signals CLK0 to CLK270 is decreased. As illustrated in FIG. 16, when the number of UI exceeds a number near $10 \times 10^3$ UI, the sum of the slow count value and the fast count value, and the absolute value of the difference between the count values are less than 30, and thus as the signal lock, 1 is outputted which indicates that frequency synchronization is achieved. Thus, the integrated value of the integration circuit 36 is reset. Specifically, as illustrated in FIG. 17, the integrated value of (the slow detection count−the fast detection count) is set to 0, and the bit of the signal bias indicated by the waveform 54 is also set to 0, the signal bias indicating that the frequency of the clock signals CLK0 to CLK270 is high.

Figure 18:
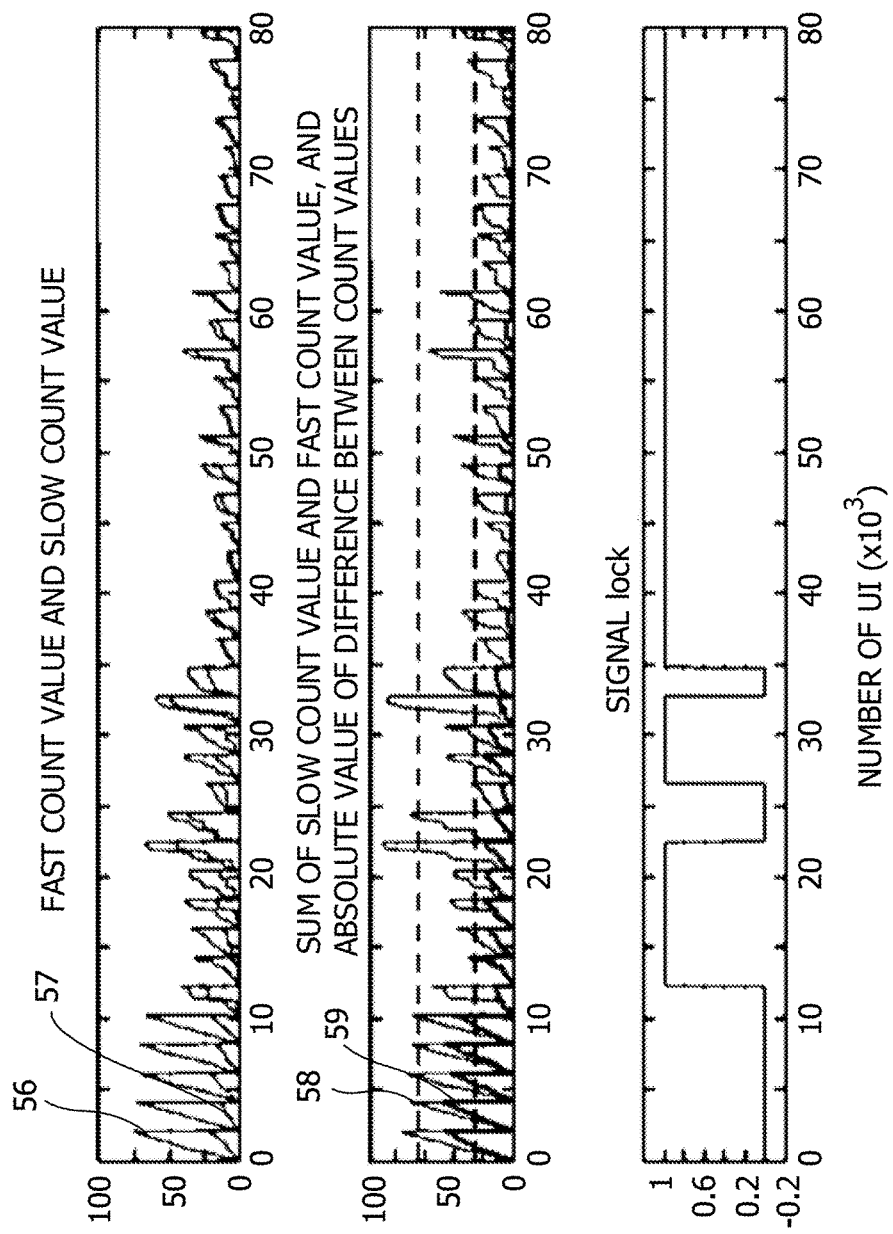
FIG. 18 illustrates an example simulation result when a jitter with a relatively large amplitude occurs.
Figure 19:
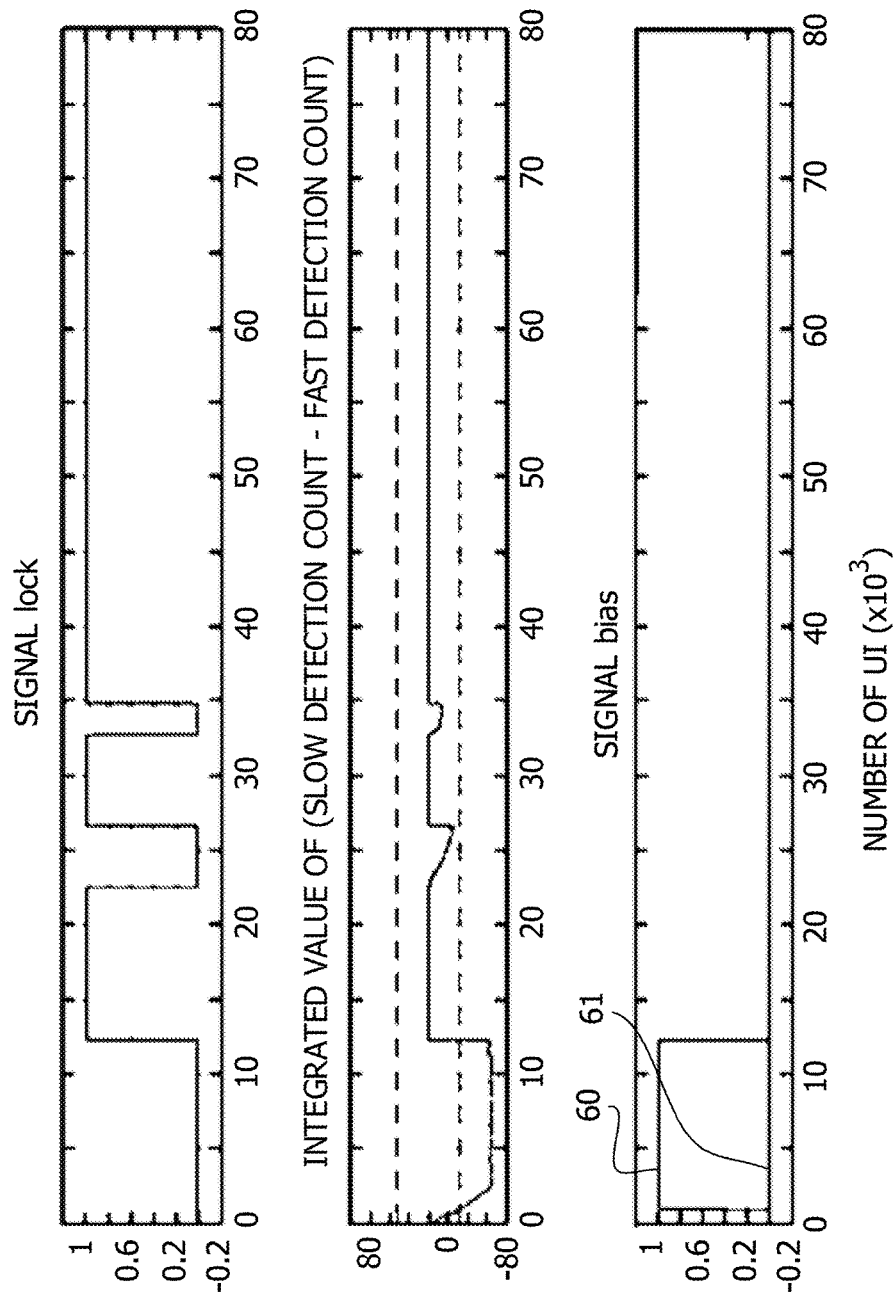
FIG. 19 illustrates an example simulation result when a jitter with a relatively large amplitude occurs.

FIGS. 18 and 19 each illustrate an example simulation result when a jitter with a relatively large amplitude occurs. The horizontal axis indicates the number of UI ($\times 10^3$). In FIGS. 18 and 19, it is assumed that jitter with an amplitude of 0.3 UIpp has occurred per 1 GHz in the data signal Di having a data rate of 28 Gb/s, and the initial value of the frequency of the clock signals CLK0 to CLK270 is higher than 7 GHz.

FIG. 18 illustrates the situation of a fast count value (waveform 56), a slow count value (waveform 57), the sum (waveform 58) of the slow count value and the fast count value, the absolute value (waveform 59) of the difference, and the signal lock. Also, FIG. 19 illustrates the situation of the signal lock, the integrated value (corresponding to the output of the integration circuit 36 in FIG. 8) of (the slow detection count−the fast detection count), and the signal bias (waveforms 60, 61).

Since the initial value of the frequency of the clock signals CLK0 to CLK270 is higher than 7 GHz which is ¼ the frequency 28 Gb/s of the data signal Di, the fast count value repeats ascending and descending in a predetermined cycle like the waveform 56. However, since the amplitude of the jitter is large, the slow count value also repeats ascending and descending in a predetermined cycle like the waveform 57.

The sum of the slow count value and the fast count value, and the absolute value of the difference between the count values also repeat ascending and descending in a predetermined cycle like the waveforms 58, 59. As illustrated in FIG. 18, up to a number near $10 \times 10^3$ UI, the absolute value of the difference between the slow count value and the fast count exceeds 30, thus as the signal lock, 0 is outputted which indicates that frequency synchronization is not achieved. Thus, as illustrated in FIG. 19, the integrated value of (the slow detection count−the fast detection count) increases to the negative side, and becomes less than −20, thus the bit of the signal bias indicated by the waveform 60 is 1, the signal bias indicating that the frequency of the clock signals CLK0 to CLK270 is high. In contrast, the bit of the signal bias indicated by the waveform 61 is 0, the signal bias indicating that the frequency of the clock signals CLK0 to CLK270 is low.

Thus, adjustment is made so that the frequency of the clock signals CLK0 to CLK270 is decreased.

As illustrated in FIG. 18, when the number of UI just exceeds a number near $10 \times 10^3$ UI, the sum of the slow count value and the fast count becomes less than 80, and the absolute value of the difference becomes less than 30, and thus as the signal lock, 1 is outputted which indicates that frequency synchronization is achieved. Thus, the integrated value of the integration circuit 36 is reset. Specifically, as illustrated in FIG. 19, the integrated value of (the slow detection count−the fast detection count) is set to 0, and the bit of the signal bias indicated by the waveform 60 is also set to 0, the signal bias indicating that the frequency of the clock signals CLK0 to CLK270 is high.

Since the amplitude of the jitter is large, as illustrated in FIG. 18, the sum (waveform 58) of the slow count value and the fast count exceeds 80 in the vicinity of $20 \times 10^3$ UI. Therefore, the signal lock is returned to 0 again. However, as illustrated in FIG. 19, the integrated value of (the slow detection count−the fast detection count) is in a range from −20 to 20, and thus the signal bias does not change.

Subsequently, as illustrated in FIGS. 18 and 19, after the processing of changing the signal lock to 1 and the processing of changing the signal lock to 0 are performed, the signal lock is set to 1 again in the vicinity of $35 \times 10^3$ UI, and the signal lock does not change subsequently.

Figure 20:
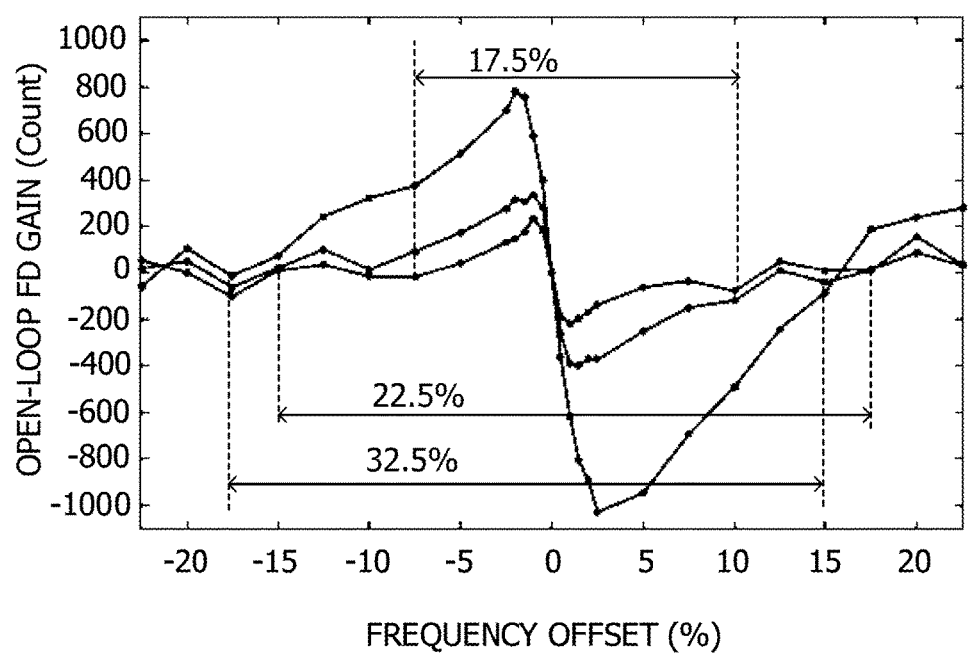
FIG. 20 illustrates an example simulation result of frequency pull-in characteristics.

Like this, it can be found that even when a jitter with a relatively large amplitude is contained in the data signal Di, frequency synchronization is properly performed. FIG. 20 illustrates an example simulation result of frequency pull-in characteristics.

The vertical axis indicates the gain (unit is Count) of frequency detection in an open loop, and the horizontal axis indicates the offset (unit is %) of frequency. FIG. 20 illustrates an example that uses a jitter tolerance pattern in Optical Internetworking Forum—Common Electrical Interface (OIF-CEI) 3.0 Standard as the jitter.

The waveform 70 illustrates frequency pull-in characteristics when the number of comparison circuits in the comparison circuit unit 42 is 10 as illustrated in FIG. 15. Also, the waveform 71 illustrates frequency pull-in characteristics when the number of comparison circuits in the comparison circuit unit 42 is 12 (the number of comparison circuits, each of which outputs a result of comparison between the data signal Di and 0 [V], is four). Also, the waveform 72 illustrates frequency pull-in characteristics when the number of comparison circuits in the comparison circuit unit 42 is 9 (the number of comparison circuits, each of which outputs a result of comparison between the data signal Di and 0 [V], is one).

When the number of comparison circuits in the comparison circuit unit 42 is 10, the frequency pull-in range is 22.5% as illustrated in FIG. 20. When the number of comparison circuits in the comparison circuit unit 42 is increased to 12, the frequency pull-in range is increased to 32.5% as illustrated in FIG. 20. However, the circuit area is increased, and the power consumption is also increased. On the other hand, when the number of comparison circuits in the comparison circuit unit 42 is decreased to 9, the frequency pull-in range is decreased to 17.5% as illustrated in FIG. 20. However, the circuit area can be reduced, and the power consumption can also be reduced.

In the above-described receiving circuit 40 in the third embodiment, the same effect as in the CDR circuit 20 in the second embodiment is obtained. Also, in the receiving circuit 40, the frequency detection unit 44a, the phase detection unit 44c, the data determination unit 44e perform processing based on a result of comparison made by the comparison circuit unit 42 in common, and thus the number of comparison circuits can be reduced, the circuit area can be further reduced, and reduction of the power consumption is also possible.

Although the CDR circuit and the receiving circuit according to an aspect of the disclosure have been described, these are only examples, and are not limited to the description above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock data recovery circuit comprising:
    a comparison circuit that receives data signal on which a first clock signal is superimposed, and outputs a result of comparison obtained by comparing the data signal with three different threshold values at a timing synchronized with a second clock signal;
    a data pattern detection circuit that detects an occurrence of a data pattern in which three consecutive bits in the data signal are a first pattern or a second pattern, based on the result of comparison;
    a frequency detection circuit that outputs, when an occurrence of the data pattern is detected at least three times, a detection result indicating whether or not a second frequency of the second clock signal is higher than a first frequency of the first clock signal, based on a change in the result of comparison between the data signal at a time of detection of a second bit of the data pattern and the three threshold values;
    an adjustment circuit that outputs, based on the detection result, an adjustment signal for adjusting a phase of the second clock signal and the second frequency; and
    an oscillator circuit that outputs the second clock signal with the phase and the second frequency adjusted, based on the adjustment signal.

2. The clock data recovery circuit according to claim 1, wherein the first pattern is "011" and the second pattern is "100".

3. The clock data recovery circuit according to claim 1, further comprising:
    a first integration circuit that outputs, based on the detection result, a first number of detection cases in which the second frequency is higher than the first frequency in a first period; and
    a second integration circuit that outputs, based on the detection result, a second number of detection cases in which the second frequency is lower than the first frequency in a first period, wherein the adjustment circuit outputs a determination result as to whether or not the data signal and the second clock signal are synchronized, based on the first number and the second number.

4. The clock data recovery circuit according to claim 3, wherein the adjustment circuit outputs the determination result indicating that the data signal and the second clock signal are synchronized when a sum of the first number and the second number is smaller than a first threshold value, and an absolute value of a difference between the first number and the second number is smaller than a second threshold value which is smaller than the first threshold value.

5. The clock data recovery circuit according to claim 1, wherein the detection result includes a first value indicating whether or not the second frequency is lower than the first frequency, and a second value indicating whether or not the second frequency is higher than the first frequency, and when an integrated value obtained by integrating a difference between the first value and the second value is greater than a third threshold value, the adjustment circuit outputs the adjustment signal for increasing the second frequency, and when the integrated value is smaller than a fourth threshold value which is smaller than the third threshold value, the adjustment circuit outputs the adjustment signal for decreasing the second frequency.

6. The clock data recovery circuit according to claim 1, wherein the adjustment circuit includes a phase detection circuit that outputs a first adjustment signal for delaying the phase of the second clock signal or a second adjustment signal for advancing the phase as the adjustment signal based on the detection result, and when the second frequency is lower than the first frequency, the phase detection circuit sets a rate of output of the second adjustment signal per unit time higher than a rate of output of the first adjustment signal per the unit time, and when the second frequency is higher than the first frequency, the phase detection circuit sets the rate of output of the second adjustment signal per the unit time lower than the rate of output of the first adjustment signal per the unit time.

7. A receiving circuit comprising:
    an equalization circuit that receives a first data signal on which a first clock signal is superimposed, performs equalization processing on the first data signal, and outputs a second data signal;
    a comparison circuit that receives the second data signal, and outputs a result of comparison obtained by comparing the second data signal with three different threshold values at a timing synchronized with a second clock signal;
    a data pattern detection circuit that detects an occurrence of a data pattern in which three consecutive bits in the second data signal are a first pattern or a second pattern, based on the result of comparison;
    a frequency detection circuit that outputs, when an occurrence of the data pattern is detected at least three times, a detection result indicating whether or not a second frequency of the second clock signal is higher than a first frequency of the first clock signal, based on a change in the result of comparison between the second data signal at a time of detection of a second bit of the data pattern and the three threshold values;
    an adjustment circuit that outputs, based on the detection result, an adjustment signal for adjusting a phase of the second clock signal and the second frequency; and
    an oscillator circuit that outputs the second clock signal with the phase and the second frequency adjusted, based on the adjustment signal.

8. The receiving circuit according to claim 7, wherein the first pattern is "011" and the second pattern is "100".

9. The receiving circuit according to claim 7, further comprising:
- a first integration circuit that outputs, based on the detection result, a first number of detection cases in which the second frequency is higher than the first frequency in a first period; and
- a second integration circuit that outputs, based on the detection result, a second number of detection cases in which the second frequency is lower than the first frequency in a first period, wherein the adjustment circuit outputs a determination result as to whether or not the data signal and the second clock signal are synchronized, based on the first number and the second number.

10. The receiving circuit according to claim 9, wherein the adjustment circuit outputs the determination result indicating that the data signal and the second clock signal are synchronized when a sum of the first number and the second number is smaller than a first threshold value, and an absolute value of a difference between the first number and the second number is smaller than a second threshold value which is smaller than the first threshold value.

11. The receiving circuit according to claim 7, wherein the detection result includes a first value indicating whether or not the second frequency is lower than the first frequency, and a second value indicating whether or not the second frequency is higher than the first frequency, and when an integrated value obtained by integrating a difference between the first value and the second value is greater than a third threshold value, the adjustment circuit outputs the adjustment signal for increasing the second frequency, and when the integrated value is smaller than a fourth threshold value which is smaller than the third threshold value, the adjustment circuit outputs the adjustment signal for decreasing the second frequency.

12. The receiving circuit according to claim 7, wherein the adjustment circuit includes a phase detection circuit that outputs a first adjustment signal for delaying the phase of the second clock signal or a second adjustment signal for advancing the phase as the adjustment signal based on the detection result, and when the second frequency is lower than the first frequency, the phase detection circuit sets a rate of output of the second adjustment signal per unit time higher than a rate of output of the first adjustment signal per the unit time, and when the second frequency is higher than the first frequency, the phase detection circuit sets the rate of output of the second adjustment signal per the unit time lower than the rate of output of the first adjustment signal per the unit time.

* * * * *